(12) United States Patent
Goldenberg et al.

(10) Patent No.: US 10,389,389 B2
(45) Date of Patent: Aug. 20, 2019

(54) METHOD AND DATA STORAGE DEVICE USING CONVOLUTIONAL LOW-DENSITY PARITY-CHECK CODING WITH A LONG PAGE WRITE AND A SHORT PAGE READ GRANULARITY

(71) Applicant: WESTERN DIGITAL TECHNOLOGIES, INC., San Jose, CA (US)

(72) Inventors: Idan Goldenberg, Ramat Hasharon (IL); Stella Achtenberg, Netanya (IL); Alexander Bazarsky, Holon (IL); Eran Sharon, Rishon Lezion (IL); Karin Inbar, Ramat-Hasharon (IL); Michael Ionin, Rehovot (IL)

(73) Assignee: Western Digital Technologies, Inc., San Jose, CA (US)

( * ) Notice: Subject to any disclaimer, the term of this patent is extended or adjusted under 35 U.S.C. 154(b) by 5 days.

(21) Appl. No.: 15/617,059

(22) Filed: Jun. 8, 2017

(65) Prior Publication Data
US 2017/0272102 A1    Sep. 21, 2017

Related U.S. Application Data

(63) Continuation-in-part of application No. 15/265,045, filed on Sep. 14, 2016, now Pat. No. 10,063,258,
(Continued)

(51) Int. Cl.
*H03M 13/37* (2006.01)
*H03M 13/00* (2006.01)
(Continued)

(52) U.S. Cl.
CPC ....... *H03M 13/616* (2013.01); *G06F 11/1012* (2013.01); *H03M 13/1105* (2013.01);
(Continued)

(58) Field of Classification Search
CPC .................................................. H03M 13/2957
(Continued)

(56) References Cited

U.S. PATENT DOCUMENTS 8,028,216 B1    9/2011    Yeo et al.
8,549,384 B1    10/2013    Huang et al.
(Continued)

FOREIGN PATENT DOCUMENTS

WO    2015191245 A1    12/2015

OTHER PUBLICATIONS

International Search Report and Written Opinion dated May 29, 2017 in International Application No. PCT/US2017/019465, 23 pages.
(Continued)

*Primary Examiner* — Fritz Alphonse
(74) *Attorney, Agent, or Firm* — Michael Best & Friedrich LLP

(57) ABSTRACT

In an illustrative example, an apparatus includes a controller and a memory that is configured to store a codeword of a convolutional low-density parity-check (CLDPC) code. The codeword has a first size and includes multiple portions that are independently decodable and that have a second size. The controller includes a CLDPC encoder configured to encode the codeword and a CLDPC decoder configured to decode the codeword or a portion of the codeword.

18 Claims, 13 Drawing Sheets

Related U.S. Application Data which is a continuation-in-part of application No. 15/179,069, filed on Jun. 10, 2016.

(60) Provisional application No. 62/303,768, filed on Mar. 4, 2016.

(51) Int. Cl.
  *H03M 13/11* (2006.01)
  *G06F 11/10* (2006.01)
  *H03M 13/35* (2006.01)

(52) U.S. Cl.
  CPC .... *H03M 13/1128* (2013.01); *H03M 13/1154* (2013.01); *H03M 13/3715* (2013.01); *H03M 13/3723* (2013.01); *H03M 13/612* (2013.01); *H03M 13/6325* (2013.01); *H03M 13/1108* (2013.01); *H03M 13/353* (2013.01)

(58) Field of Classification Search
  USPC ................................ 714/786, 788, 789, 790
  See application file for complete search history.

(56) References Cited

U.S. PATENT DOCUMENTS

| | | |
|---|---|---|
| 8,645,789 B2 | 2/2014 | Sharon et al. |
| 8,924,815 B2 | 12/2014 | Frayer et al. |
| 9,032,269 B2 | 5/2015 | Sharon et al. |
| 9,674,021 B2 | 6/2017 | Mun et al. |
| 2007/0060061 A1 | 3/2007 | Sampath |
| 2008/0310554 A1 | 12/2008 | Siti et al. |
| 2009/0125764 A1 | 5/2009 | Sung et al. |
| 2010/0111160 A1 | 5/2010 | Siti |
| 2013/0132804 A1 | 5/2013 | Frayer et al. |
| 2013/0145238 A1 | 6/2013 | Alhussien et al. |
| 2014/0068370 A1 | 3/2014 | Murakami et al. |
| 2014/0173382 A1 | 6/2014 | Yang et al. |
| 2016/0087649 A1 | 3/2016 | Limberg |
| 2017/0257117 A1* | 9/2017 | Goldenberg ........ G06F 11/1012 |
| 2017/0257118 A1* | 9/2017 | Goldenberg ........ G06F 11/1076 |

OTHER PUBLICATIONS

Ryabinin et al., "Storage Device Operations Based on Bit Error Rate (BER) Estimate" U.S. Appl. No. 14/925,676, filed Oct. 28, 2015, 37 pages.

Ravimohan et al., "Partial Soft Bit Read," U.S. Appl. No. 14/927,088, filed Oct. 29, 2015, 38 pages.

Costello et al., "Spatially Coupled Sparse Codes on Graphs: Theory and Practice," IEEE Communications Magazine, Jul. 2014, pp. 168-176.

Felstrom et al., Time-varying Periodic Convolutional Codes with Low-density Parity-check Matrices, IEEE Transactions on Information Theory, vol. 45, No. 6, Sep. 1999, pp. 2181-2191.

Iyengar et al., "Windowed Decoding of Protograph-based LDPC Convolutional Codes over Erasure Channels", IEEE Transactions on Information Theory, vol. 58, No. 4, Apr. 2012, 18 pages.

Kudekar et al., "Threshold Saturation via Spatial Coupling: Why Convolutional LDPC Ensembles Perform So Well over the BEC", IEEE Transactions on Information Theory, vol. 57, No. 2, Feb. 2011, 29 pages.

Lentmaier et al., "Iterative Decoding Threshold Analysis for LDPC Convolutional Codes," IEEE Transactions on Information Theory, vol. 56, No. 10, Oct. 2010, pp. 5274-5289.

* cited by examiner

US 10,389,389 B2

METHOD AND DATA STORAGE DEVICE USING CONVOLUTIONAL LOW-DENSITY PARITY-CHECK CODING WITH A LONG PAGE WRITE AND A SHORT PAGE READ GRANULARITY

CROSS-REFERENCE TO RELATED APPLICATIONS

The present application is a continuation-in-part of U.S. patent application Ser. No. 15/265,045, filed Sep. 14, 2016, which is a continuation-in-part of U.S. patent application Ser. No. 15/179,069, filed Jun. 10, 2016, which claims the benefit of U.S. Provisional Patent Application No. 62/303,768, filed Mar. 4, 2016, the contents of all of which are incorporated by reference herein in their entirety.

FIELD OF THE DISCLOSURE

The present disclosure is generally related to electronic devices and more particularly to convolutional low-density parity-check coding for an electronic device.

BACKGROUND

Storage devices enable users to store and retrieve data. Examples of storage devices include volatile memory devices and non-volatile memory devices. A non-volatile memory may retain data after a power-down event, and a volatile memory may lose data after a power-down event.

Data written to and read from a storage device may be subject to one or more errors. For example, electronic noise may affect a storage element of a storage device and may cause the storage element to indicate an "incorrect" state.

Storage devices may use error correction coding (ECC) techniques to increase reliability of stored data. For example, an ECC technique may specify that redundancy information is to be added to data to generate a codeword prior to storing the data at a memory. During a read process to read the data, the redundancy information may be used to correct one or more errors of the codeword (up to an error correction capability associated with the ECC technique).

Certain ECC techniques provide a relatively high level of error correction capability. For example, by using a relatively large amount of redundancy information, error correction capability may be increased. Increasing an amount of redundancy information may affect data decoding throughput and data storage density. For example, in some cases, increasing the amount of redundancy may increase throughput due to increased speed of decoding operations, and in other cases increasing the amount of redundancy may decrease throughput due to additional computations associated with the redundancy information. Further, increasing a number of linear equations associated with a codeword (in order to generate additional redundancy information) may complicate certain encoding and/or decoding operations (e.g., the ECC technique may not be relatively "encodeable"). Other ECC techniques may increase decoding throughput and data storage density by reducing an amount of redundancy information. In some circumstances, a number of errors may exceed an error correction capability associated with an ECC technique, which may result in an uncorrectable error correcting code (UECC) error and data loss.

Storage devices may operate in a sequential mode in which data is accessed via a sequence of consecutive logical addresses and may also operate in a random read mode in which data is accessed at non-sequential logical addresses. In addition, some storage devices may have a write unit size (e.g., 16 kilobytes (kB)) for writing data that is larger than a read unit size (e.g., 1 kB) for reading data. Encoding data using 16 kB codeword sizes based on a 16 kB write unit size may provide higher error correction capability as compared to encoding data using a 1 kB codeword size based on a 1 kB read unit size. However, decoding the data involves reading the entire 16 kB codeword, which impairs random read performance when reading 1 kB data units.

DETAILED DESCRIPTION

Figure 1:
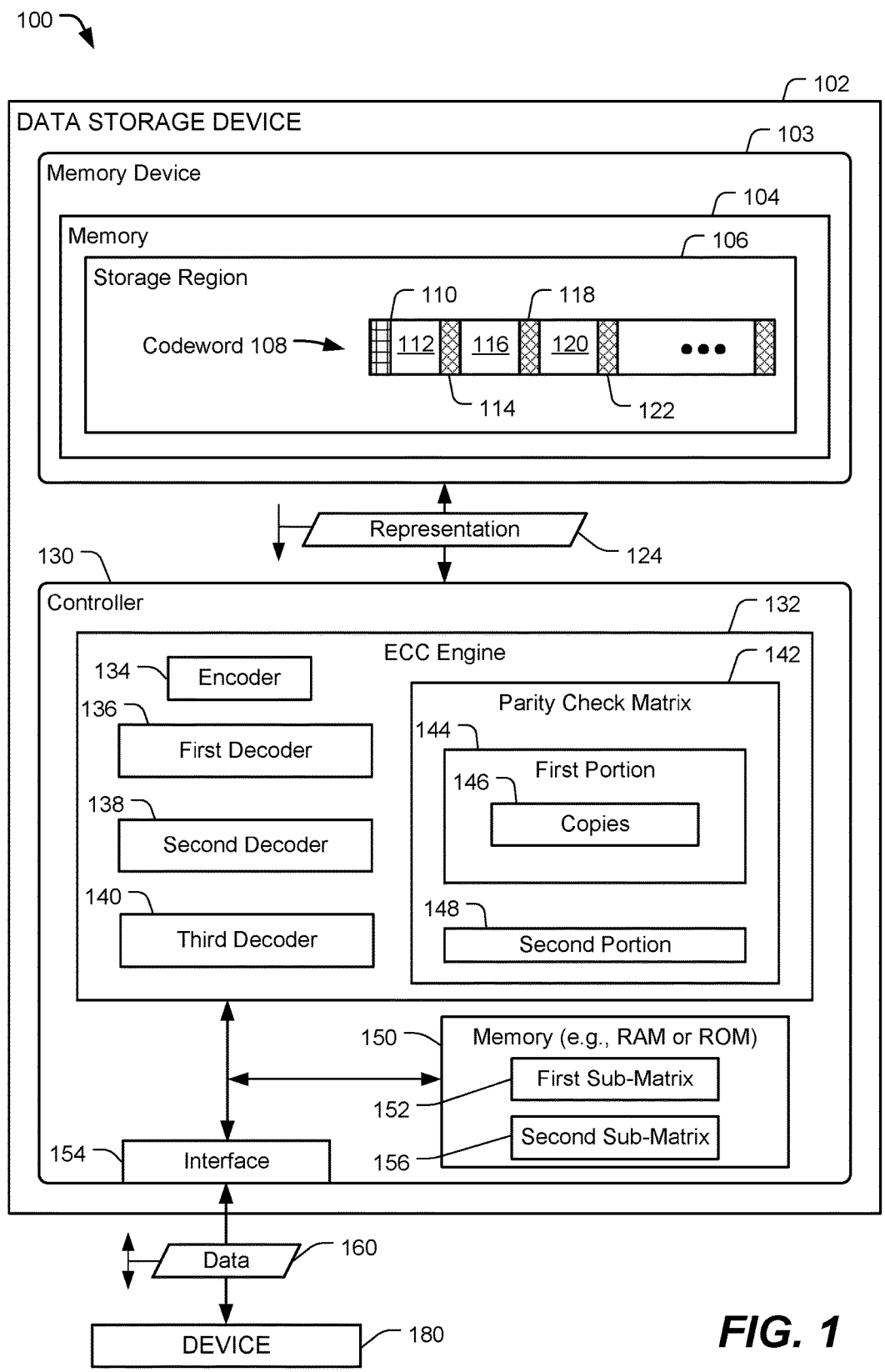
FIG. 1 is a diagram of a particular illustrative example of a system including a data storage device that is configured to operate based on a convolutional low-density parity-check (CLDPC) code.

Aspects of a convolutional low-density parity-check (CLDPC) code are disclosed to enable high decoding throughput and encodeability while also achieving a relatively high error correction capability. In a first example, a parity check matrix of the CLDPC code includes a plurality of copies of a sub-matrix forming a first portion of the parity check matrix. Use of a plurality of copies of a sub-matrix to form the first portion of the parity check matrix may simplify device operation. For example, the sub-matrix may correspond to a low-complexity code that is "shrunk" (to a size of a sub-matrix) and then repeated (instead of constructing a "full" matrix to create the first portion). The parity check matrix may further include a second portion (e.g., a "tail" or a "terminating" portion). The second portion may increase encodeability of the parity check matrix, such as by diagonalizing the parity check matrix. In an illustrative implementation, a windowed CLDPC decoding process includes decoding portions of a CLDPC codeword using windows (e.g., non-overlapping subsets) of the parity check matrix in parallel to increase decoding throughput.

Alternatively or in addition to the first example, a windowed CLDPC decoding process according to a second example uses multiple decoders having different window sizes. For example, the multiple decoders may include a first decoder associated with a first power consumption, a second decoder associated with a second power consumption that is greater than the first power consumption, and a third decoder that is associated with a third power consumption that is greater than the second power consumption. A data size of a memory accessed by the multiple decoders may be selected based on the third decoder (e.g., based on a number of soft bits used by the third decoder). As a result, memory space of the memory may be "unused" during operation of the first decoder and the second decoder. A size of a first window used by the first decoder and/or a size of a second window used by the second decoder may be increased as compared to a size of a third window of the third decoder.

Alternatively or in addition to the first example and the second example, a CLDPC codeword according to a third example may include error correction information at certain "check points" of the CLDPC codeword. Portions of the CLDPC codeword may be decoded using the error correction information and may be sent to a device in a serial manner. For example, decoding of the CLDPC codeword may be performed in a pipelined manner, and each portion of the CLDPC codeword may be provided separately to the device upon decoding.

Alternatively or in addition to the first example, the second example, and the third example, a portion of a CLDPC codeword may be accessed according to a fourth example. An estimated number of errors may be determined based on the portion (e.g., a subset) of the CLDPC codeword. For example, the estimated number of errors may correspond to a bit error rate (BER). The estimated number of errors may be used in connection with a management operation, such as a memory management operation or a health management operation, as illustrative examples. Alternatively or in addition, the estimated number of errors may be used in connection with decoding of the CLDPC codeword. In some circumstances, using a portion of the CLDPC codeword (instead of the full CLDPC codeword) may reduce an amount of information sent between a controller and a memory and may reduce an amount of time used to estimate a BER.

Particular aspects of the disclosure are described below with reference to the drawings. In the description, common or similar features may be designated by common reference numbers. As used herein, "exemplary" may indicate an example, an implementation, and/or an aspect, and should not be construed as limiting or as indicating a preference or a preferred implementation.

Although certain examples are described herein with reference to a data storage device, it should be appreciated that techniques described herein are applicable to other implementations. For example, information can be received by a communication device (e.g., wirelessly or from a wired network) alternatively or in addition to accessing information from a memory. As an illustrative example, CLDPC techniques may be utilized to improve reliability of wired or wireless communications. Those of skill in the art will recognize that techniques described herein are applicable to other implementations.

Further, although certain aspects as described concurrently with reference to FIG. 1, it should be appreciated that in some implementations a device may operate according to a subset of aspects described with reference to FIG. 1. In addition, although certain examples (e.g., examples of FIG. 1 and FIG. 10) are described separately for convenience, it is noted that aspects described herein may be combined without departing from the scope of the disclose.

Referring to FIG. 1, a particular illustrative example of system is depicted and generally designated 100. The system 100 includes a data storage device 102 and a device 180 (e.g., a host device or an access device). The data storage device 102 includes a memory device 103 and a controller 130. The controller 130 is coupled to the memory device 103.

The memory device 103 includes a memory 104, such as a non-volatile array of storage elements included in one or more memory dies. The memory 104 may include a flash memory (e.g., a NAND flash memory) or a resistive memory, such as a resistive random access memory (ReRAM), as illustrative examples.

The memory 104 includes one or more regions of storage elements, such as a storage region 106. An example of the storage region 106 is a block, such as a NAND flash erase group of storage elements, or a group of resistance-based storage elements in a ReRAM implementation. Another example of the storage region 106 is a word line of storage elements (e.g., a word line of NAND flash storage elements or a word line of resistance-based storage elements). The storage region 106 may have a single-level-cell (SLC) configuration, a multi-level-cell (MLC) configuration, or a tri-level-cell (TLC) configuration, as illustrative examples. Each storage element of the storage region 106 may be programmable to a state (e.g., a threshold voltage in a flash configuration or a resistive state in a resistive memory configuration) that indicates one or more values. As an example, in an illustrative TLC scheme, a storage element of the storage region 106 may be programmable to a state that indicates three values. As an additional example, in an illustrative MLC scheme, a storage element of the storage region 106 may be programmable to a state that indicates two values.

The controller 130 may include an error correcting code (ECC) engine 132, a memory 150 coupled to the ECC engine 132, and an interface 154 (e.g., a host interface or an access device interface). The memory 150 may include a random access memory (RAM), a read-only memory (ROM), another memory, or a combination thereof. The interface 154 is configured to receive data 160 from the device 180 in connection with a request for write access to the memory 104. The interface 154 is configured to provide the data 160 to the device 180 in connection with a request for read access to the memory 104.

The ECC engine 132 may include one or more encoders, such as an encoder 134. The ECC engine 132 may include one or more decoders, such as a first decoder 136, a second decoder 138, and a third decoder 140. In an illustrative example, the first decoder 136 is coupled to the second decoder 138 (e.g., an output of the first decoder 136 may be coupled to an input of the second decoder 138), and the second decoder 138 is coupled to the third decoder 140 (e.g., an output of the second decoder 138 may be coupled to an input of the third decoder 140). In another implementation, the output of the first decoder is not coupled to the input of the second decoder, such as if the second decoder 138 is configured to receive data to be decoded from the memory device 103 (instead of from the first decoder 136). Although the example of FIG. 1 illustrates three decoders, it should be appreciated that in other implementations the ECC engine 132 may include a different number of decoders, such as one decoder, two decoders, four decoders, or another number of decoders.

The ECC engine 132 is configured to operate based on a convolutional low-density parity-check (CLDPC) code. For example, the ECC engine 132 may be configured to process the data 160 based on a parity check matrix 142 associated with a CLDPC code. The parity check matrix 142 may include a first portion 144 and a second portion 148. The first portion 144 may include a plurality of copies 146 of a first sub-matrix 152 that is associated with a first sub-code (e.g., a systematic sub-code) of a CLDPC code, and the second portion 148 may include at least one copy of a second sub-matrix 156 that is associated with a second sub-code of the CLDPC code. FIG. 1 illustrates that the memory 150 may be configured to store a copy of the first sub-matrix 152 and a copy of the second sub-matrix 156.

During operation, the controller 130 may receive the data 160 from the device 180. The controller 130 may process the data 160 in accordance with a CLDPC code. For example, controller 130 may input the data 160 to the ECC engine 132 to be encoded by the encoder 134 to generate one or more codewords associated with the CLDPC code, such as a codeword 108. The encoder 134 may be configured to encode the data 160 based on the parity check matrix 142 or based on another matrix that is associated with the parity check matrix 142 (e.g., based on a generator matrix that is based on the parity check matrix 142).

In some implementations, the encoder 134 is configured to insert one or more check point portions in the codeword 108 in connection with an encoding process. For example, the encoder 134 may be configured to insert a first check point portion 114 between a first data portion 112 and a second data portion 116. As another example, the encoder 134 may be configured to insert a second check point portion 118 between the second data portion 116 and a third data portion 120. As an additional example, the encoder 134 may be configured to insert a third check point portion 122 after the third data portion 120. FIG. 1 also depicts that the codeword 108 may include metadata, such as a header 110.

In an illustrative example, the first check point portion 114 includes first error correcting information (or first error detecting information), such as a first cyclic redundancy check (CRC) associated with the header 110 and the first data portion 112. The second check point portion 118 may include second error correcting information (or second error detecting information), such as a second CRC associated with the second data portion 116. The third check point portion 122 may include third error correcting information, such as a third CRC associated with the third data portion 120.

The controller 130 may send the one or more codewords to the memory device 103 to be stored at the memory 104, and the memory 104 is configured to store the one or more codewords. For example, the controller 130 may send a write command to cause the memory device 103 to store the codeword 108 to the storage region 106.

The controller 130 may cause the memory device 103 to access a representation of the codeword 108, such as in response to a request for read access from the device 180. The controller 130 may send a read command to cause the memory device 103 to sense a representation 124 of the codeword 108 (e.g., a version of the codeword 108 that may differ from the codeword 108 due to one or more errors). The memory device 103 may provide the representation 124 of the codeword 108 to the controller 130.

The controller 130 may input the representation 124 of the codeword 108 to the ECC engine 132 to initiate a decoding process. For example, one or more of the decoders 136, 138, and 140 may perform one or more operations of the decoding process. One or more of the decoders 136, 138, and 140 may be configured to decode the representation 124 of the codeword 108 based on the parity check matrix 142.

In an illustrative implementation, the decoders 136, 138, and 140 are configured to operate using a windowed decoding process. The windowed decoding process may include decoding a portion of the representation 124 based on a corresponding window (e.g., subset of rows and columns) of the parity check matrix 142.

To further illustrate, the first decoder 136 may be configured to perform a first decoding operation based on a first window W1 of the parity check matrix 142. The first window W1 may correspond to a first subset of rows and columns of the parity check matrix 142, and the first decoder 136 may adjust (e.g., move or "slide") the first window W1 to select another subset of rows and columns of the parity check matrix 142.

In an illustrative example, the first decoder 136 decodes a first data portion of the representation 124 (e.g., the first data portion 112) in connection with the first decoding operation. The second decoder 138 may be configured to perform a second decoding operation based on a second window W2 of the parity check matrix 142, and the third decoder 140 may be configured to perform a third decoding operation based on a third window W3 of the parity check matrix 142. In an illustrative example, the second decoder 138 decodes a second data portion of the representation 124 (e.g., the second data portion 116) in connection with the second decoding operation, and the third decoder 140 decodes a third data portion of the representation 124 (e.g., the third data portion 120) in connection with the third decoding operation. The first window W1 may have a first size that is greater than a second size of the second window W2, and the third window W3 may have a third size that is less than the second size of the second window W2. The second window W2 may correspond to a second subset of rows and columns of the parity check matrix 142, and the second decoder 138 may adjust (e.g., move or "slide") the second window W2 to select another subset of rows and columns of the parity check matrix 142. The third window W3 may correspond to a second subset of rows and columns of the parity check matrix 142, and the third decoder 140 may adjust (e.g., move or "slide") the third window W3 to select another subset of rows and columns of the parity check matrix 142.

As used herein, a windowed decoding operation may use a subset of the parity check matrix 142 to decode a data portion having a data size corresponding to (e.g., equal to)

a size of the subset. For example, a first data size (e.g., a first number of bits) of a first data portion decoded by the first decoder 136 may correspond to a first size of the first window W1. As additional examples, a second data size (e.g., a second number of bits) of a second data portion decoded by the second decoder 138 may correspond to a second size of the second window W2, and a third data size (e.g., a third number of bits) of a third data portion decoded by the third decoder 140 may correspond to a third size of the third window W3.

In an illustrative example, operation of the first decoder 136 is associated with a first power consumption, operation of the second decoder 138 is associated with a second power consumption that is greater than the first power consumption, and operation of the third decoder 140 is associated with a third power consumption that is greater than the second power consumption. To illustrate, the first decoder 136 may use a first number of soft bits (e.g., zero soft bits or one soft bit, as illustrative examples) for each bit of the representation 124 during message passing between check nodes and variable nodes of the first decoder 136. The second decoder 138 may use a second number of soft bits (e.g., three soft bits, as an illustrative example) that is greater than the first number, and the third decoder 140 may use a third number of soft bits (e.g., five soft bits, as an illustrative example) that is greater than the second number. In this example, operation of the first decoder 136 may consume less power than operation of the second decoder 138, and operation of the second decoder 138 may consume less power than operation of the third decoder 140.

In an illustrative example, a data size (e.g., a memory capacity) of the memory 150 is selected based on a message size of the third decoder 140. For example, because a size of messages passed between variable nodes and check nodes of the third decoder 140 may be greater than sizes of messages used by the first decoder 136 and the second decoder 138, the data size of the memory 150 may be selected based on the message size of the third decoder 140 instead of based on the first decoder 136 or the second decoder 138.

In some implementations, the ECC engine 132 is configured to perform one or more decoding operations concurrently. For example, the first decoder 136 may perform a first decoding operation in parallel with a second decoding operation performed by the second decoder 138. In this example, the first window W1 may be non-overlapping relative to the second window W2. Alternatively or in addition, the first decoder 136 may perform the first decoding operation in parallel with a third decoding operation performed by the third decoder 140. In this example, the first window W1 may be non-overlapping relative to the third window W3. Alternatively or additionally, windowing of the first decoding operation may be performed in one direction (e.g., from left to right using a "forward" windowed decoding process), and windowing of the second decoding operation may be performed in the opposite direction (e.g., from right to left using a "reverse" windowed decoding process).

In another example, one or more of the second decoder 138 or the third decoder 140 may be configured to retry the first decoding operation in response to detecting a failure of the first decoding operation by the first decoder 136. For example, if the first decoder 136 is unable to successfully decode the first data portion 112 based on the first number of soft bits and the first power consumption, the second decoder 138 may attempt to decode the first data portion 112 based on the second number of soft bits and the second power consumption. Further, if the second decoder 138 is unable to successfully decode the first data portion 112 (or another portion, such as the second data portion 116) based on the second number of soft bits and the second power consumption, the third decoder 140 may attempt to decode the first data portion 112 based on the third number of soft bits and the third power consumption.

If the first decoder 136 performs the first decoding operation successfully, the first decoder 136 may perform the second decoding operation in response to success of the first decoding operation by the first decoder 136. In this case, a windowed decoding process may include attempting a decoding operation using the first window W1 and may use the second window W2 and/or the third window W3 in response to decoding failure by the first decoder 136 using the first window W1.

In some implementations, the controller 130 is configured to select one or more particular portions of the codeword 108 to be selectively decoded. To illustrate, in some circumstances, the controller 130 may access metadata (e.g., the header 110) of the codeword 108, such as in response to a request for the metadata from the device 180. In this case, the controller 130 may decode the header 110 and the first data portion 112 using the first check point portion 114 to check the decoding result and may provide the header 110 to the device 180 (e.g., without providing one or more other data portions of the data 160 to the device 180).

In some implementations, the controller 130 is configured to decode portions of the representation 124 serially (e.g., using a pipelined decoding process) and to provide portions of the representation 124 to the device 180 serially. In this example, the controller 130 may provide the header 110 and the first data portion 112 to the device 180 prior to providing one or more other data portions of the data 160 to the device 180. Components of the data storage device 102 (or the system 100) may function as pipeline stages of a decoding pipeline during a pipelined decoding process. In an illustrative example, a wired or wireless connection used to transfer data from the memory device 103 to the controller 130 functions as a first pipeline stage, the ECC engine 132 functions as a second pipeline stage, and a wired or wireless connection used to transfer data from the controller 130 to the device 180 functions as a third pipeline stage. For example, the ECC engine 132 may perform decoding of a first portion of the representation 124 using the first decoder 136 and may initiate the transfer of a second portion of the representation 124 into the ECC engine 132 while decoding of the first portion is performed by the first decoder 136. By serially providing decoded data to the device 180, memory size of a RAM of the controller 130 may be conserved or reduced.

The ECC engine 132 may be configured to output the first decoded data prior to outputting the second decoded data. For example, the interface 154 may be configured to output the first decoded data prior to convergence of the second decoded data. In some implementations, the interface 154 may be configured to output the first decoded data in parallel with receiving the second portion from the memory 104.

In an illustrative implementation, the ECC engine 132 is configured to generate a representation of the parity check matrix 142 (or the first portion 144 of the parity check matrix 142) based on the first sub-matrix 152. For example, the ECC engine 132 may access a first copy of the first sub-matrix 152 (e.g., from the memory 150, such as in response to a power-up event of the data storage device 102) and may generate at least a second copy of the plurality of copies 146 based on the first copy. The ECC engine 132 may be configured to copy the first sub-matrix 152 into the first portion 144 to generate the plurality of copies 146. Alternatively or in addition, the ECC engine 132 may be configured to generate the second portion 148 based on a copy of the second sub-matrix 156 stored at the memory 150. In an illustrative example, the copies 146 correspond to transverse (or transposed) copies of the first sub-matrix 152, as described further with reference to FIG. 2.

Figure 2:
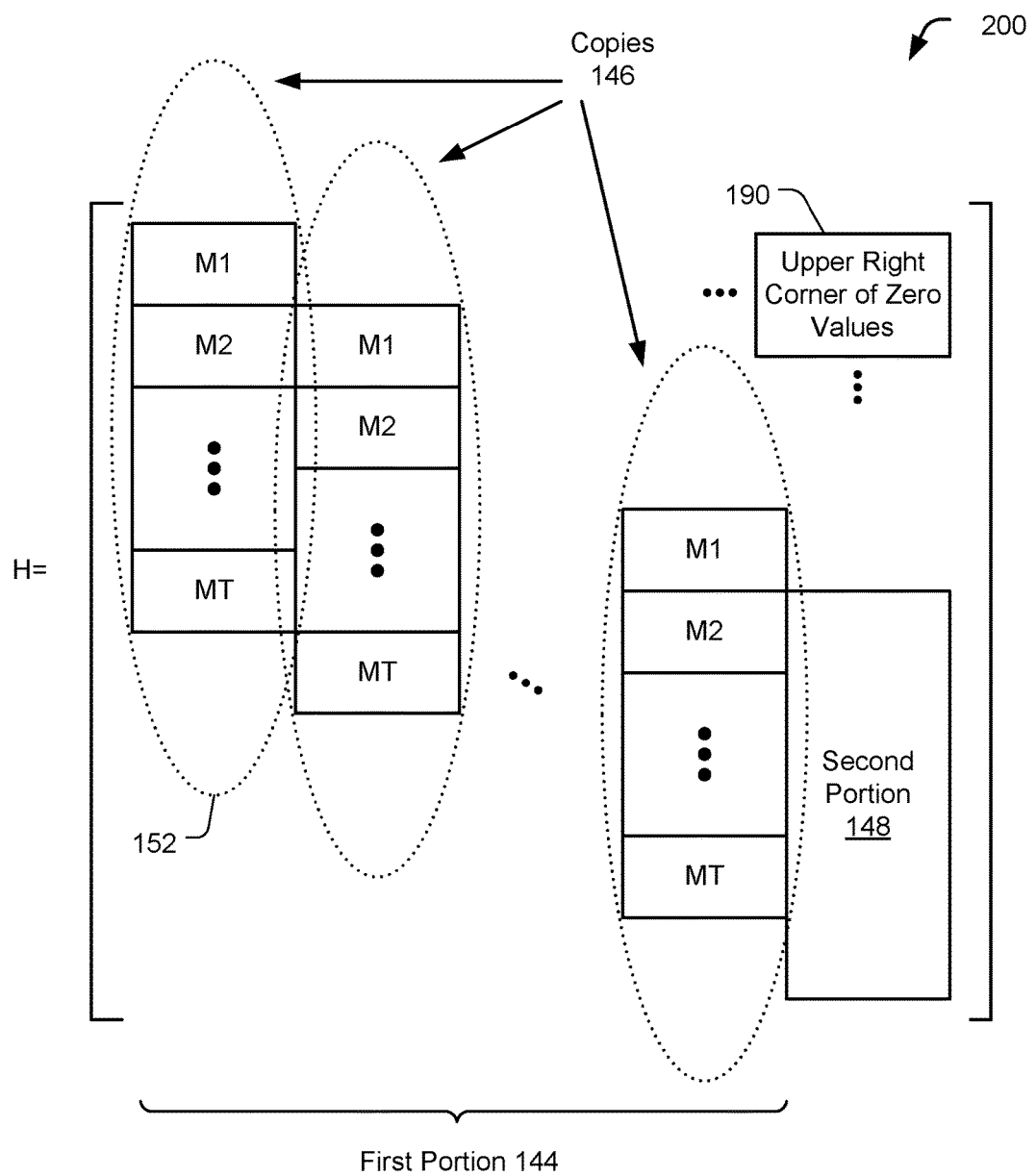
FIG. 2 is a diagram illustrating particular aspects of an example of a parity check matrix corresponding to a CLDPC code.

Referring to FIG. 2, an illustrative example of a parity check matrix is depicted and generally designated 200. The parity check matrix 200 may correspond to the parity check matrix 142 of FIG. 1. The parity check matrix 200 includes the first portion 144 and the second portion 148.

The first portion 144 includes a plurality of copies of the first sub-matrix 152. In the example of FIG. 2, the first sub-matrix 152 includes matrices M1, M2, . . . MT (e.g., a matrix "stack"). Each matrix "stack" (M1, M2, . . . MT) may correspond to another CLDPC code. In an illustrative implementation, the matrices M1, M2, . . . MT correspond to a transpose of a horizontally replicated CLDPC code (e.g., the matrices M1, M2, . . . MT may be vertically replicated instead of horizontally replicated as in a horizontally replicated CLDPC code).

The first portion 144 may include a first number of columns, and the second portion 148 may include a second number of columns. The second number may be selected based on the first number. For example, the second number may correspond to a "remainder" or a "tail" that is determined after construction of the first portion 144. Each copy of the first sub-matrix 152 may correspond to a systematic sub-code (e.g., each copy of the first sub-matrix 152 may include an information portion and a parity portion). A variable node degree associated with the first portion 144 may be equal to a variable node degree associated with the second portion 148. The second portion 148 may have a diagonal configuration.

The parity check matrix 200 also includes zero values, such as an upper right corner of zero values 190. The upper right corner of zero values 190 may enable a first set of values of the codeword 108 to be decodable independently of a second set of values of the codeword 108 (e.g., if the first set of values does not participate in parity check equations associated with the second set of values).

Figure 3:
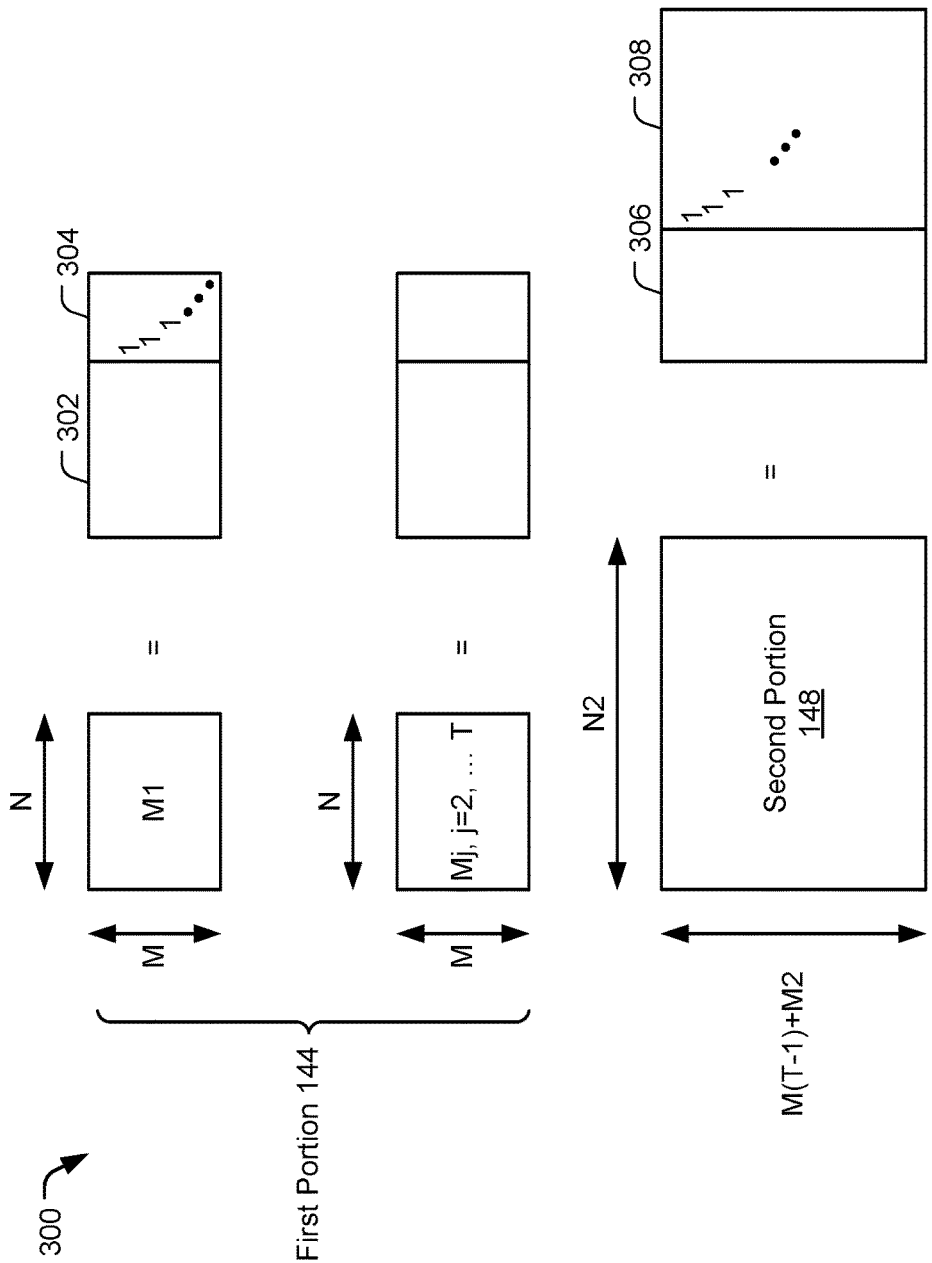
FIG. 3 is another diagram illustrating particular aspects of an example of a parity check matrix corresponding to a CLDPC code.

Referring to FIG. 3, an illustrative example of a parity check matrix is depicted and generally designated 300. The parity check matrix 300 may correspond to the parity check matrix 142 of FIG. 1. The parity check matrix 300 includes the first portion 144 (illustrated in FIG. 3 as M1 . . . Mj, where j=T) and the second portion 148.

In FIG. 3, each matrix of the first portion 144 includes N columns and M rows, where N and M are positive integers. The second portion 148 may include N2 columns and M(T−1)+M2 rows, where N2 and M2 are positive integers. Each matrix of the first portion 144 may include an information portion 302 and a parity portion 304. The second portion 148 may include an information portion 306 and a parity portion 308.

Each copy of the first sub-matrix 152 may include multiple portions, and at least one of the multiple portions may have a diagonal configuration. As used herein, a lower triangular configuration may refer to a set of matrix entries in which most entries above a main diagonal are zero. Parity portions (e.g., the parity portions 304 and 308) of the parity check matrix 300 may have a lower triangular configuration. The second portion 148 may increase encodeability of the parity check matrix 300 (e.g., by ensuring that the parity check matrix 300 has a lower triangular configuration).

The first portion 144 may include a first group of columns associated with data, a second group of columns associated with parity, and a third group of columns associated with data. For example, the first portion 144 may include a first group of columns associated with data (e.g., columns of the information portion 302), a second group of columns associated with parity (e.g., columns of the parity portion 304), and a third group of columns associated data (e.g., columns of an information portion of another copy of the first sub-matrix 152). The first group may be adjacent to the second group, and the second group may be adjacent to the third group. In some implementations, a pattern of data and parity (e.g., a pattern of data, parity, data, parity, etc.) is repeated for the remainder of the first portion.

FIG. 3 also illustrates that the first portion 144 may be sub-divided into T matrices, each with M rows and N columns. The M rightmost columns of the first portion 144 may include a diagonalized (e.g., lower triangular) section. The second portion 148 may include M*(T−1)+M2 rows (where M2<=M) and may further include N2 columns (where N2<=N). Thus, in an illustrative example, the second portion 148 may include at most the same number of rows and columns as a copy of the first sub-matrix 152. The rightmost M*(T−1)+M2 columns of the second portion 148 may include a diagonalized (e.g., lower triangular) section. In this case, the main diagonal of the parity check matrix 300 may include a sequence of lower triangular sections (of size M) and a "final" lower triangular section of size M*(T−1)+M2. This sequence of lower triangular sections may enable efficient encoding of the data 160, such as by placing parity bits in indices corresponding to the lower triangular sections (e.g., so that the parity is "scattered" along the codeword 108).

Figure 4:
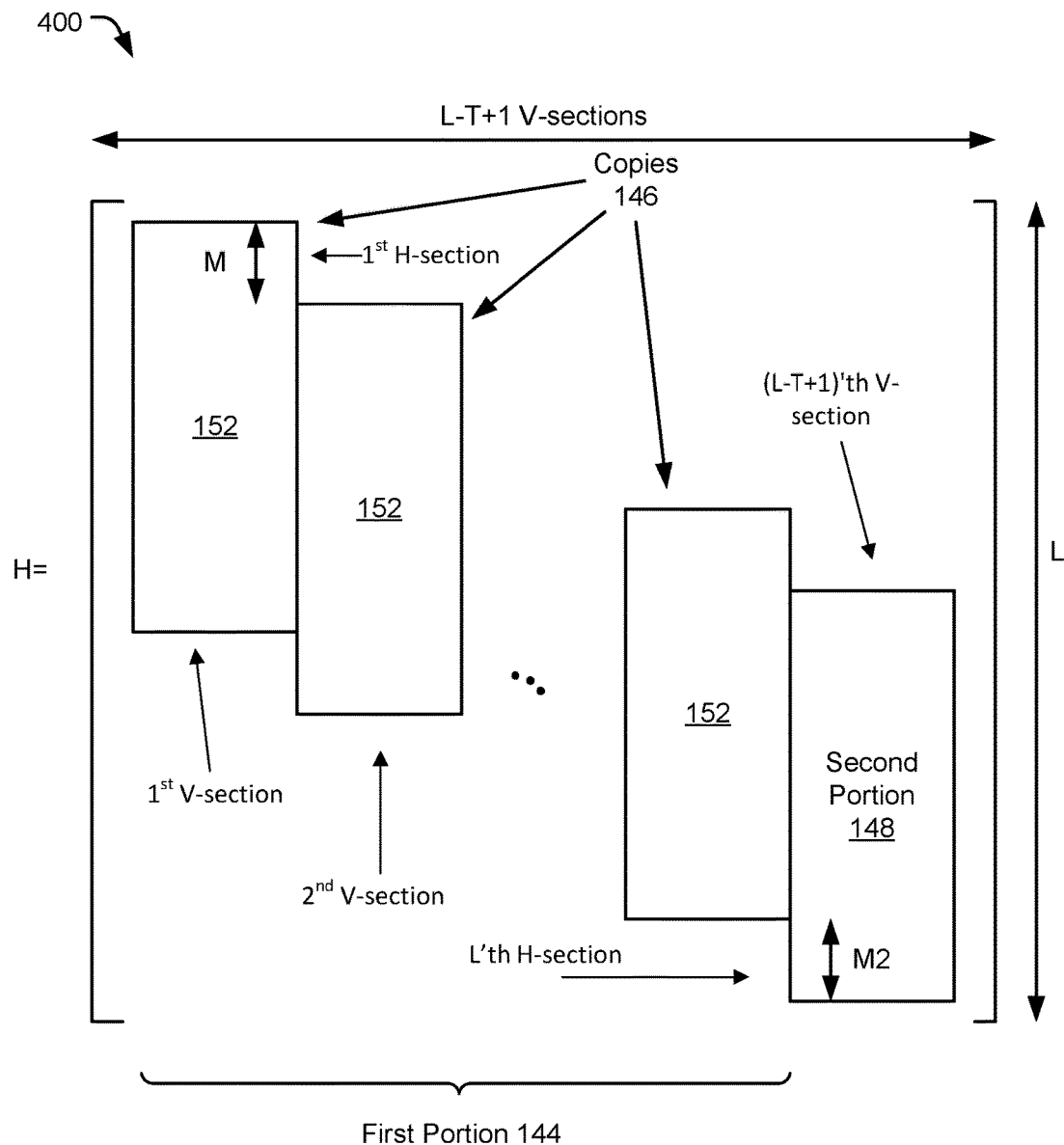
FIG. 4 is another diagram illustrating particular aspects of an example of a parity check matrix corresponding to a CLDPC code.

Referring to FIG. 4, an illustrative example of a parity check matrix is depicted and generally designated 400. The parity check matrix 400 may correspond to the parity check matrix 142 of FIG. 1. The parity check matrix 400 includes the first portion 144 (illustrated in FIG. 4 as a plurality of copies of the first sub-matrix 152) and the second portion 148.

The parity check matrix 400 includes multiple horizontal sections (h-sections) and multiple vertical sections (v-sections). In the example of FIG. 4, the parity check matrix 400 includes L−T+1 v-sections and also includes L h-sections.

In an illustrative example, a process to generate a CLDPC code includes determining a set of parameters, such as M, M2, N, N2, L, and Z, based on a target information and parity length. M may indicate a number of checks per h-section (excluding the last h-section), M2 may indicate a number of checks of the last h-section (where M2<=M), N may indicate a number of variables per v-section (excluding the last v-section), and N2 may indicate a number of variables of the last v-section (where N2<=N). L may indicate a number of the h-sections, SP may indicate a spreading pattern, and Z may indicate a lifting factor. After determining the set of parameters, the process may include generating protographs (e.g., where Z=1) with varying variable node degrees (e.g. 4, 5, and 6) and varying SP values. After generating the protographs, the process may include identifying a subset of the set of parameters that increases a density evolution decoding threshold using EXIT charts.

A parity check matrix in accordance with the disclosure may have a constant variable degree (dv) that is spread over the smaller matrices in a column M1, M2, . . . MT. The spreading pattern (SP) may be a vector of length T, where the ith element includes the dv of Mi. After determining the spreading pattern, the portions 144, 148 may be constructed. For example, the spreading pattern may be 3,1,1,1 with dv=6 for all columns (v-sections).

A first copy of the plurality of copies 146 may extend from a first row of the parity check matrix 400 to a second row of the parity check matrix 400, a second copy of the plurality of copies 146 may span from a third row to a fourth row of the parity check matrix 400, and the third row may lie between the first and second rows. Vertical offsets of the copies of the first sub-matrix 152 may be identical, and horizontal offsets of copies of the first sub-matrix 152 may be identical. A variable node degree associated with the first portion 144 may be equal to a variable node degree associated with the second portion 148.

Figure 5:
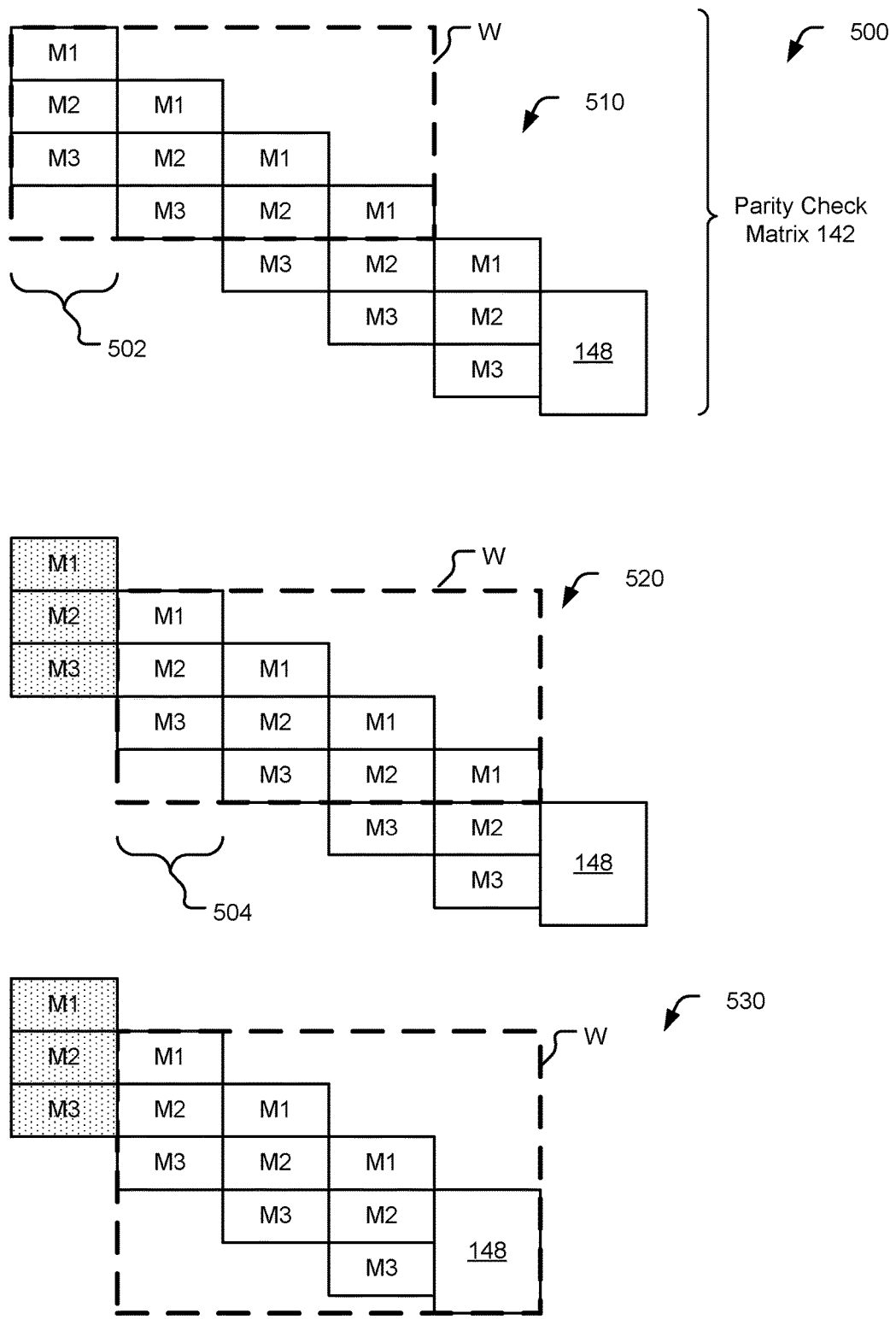
FIG. 5 is a diagram illustrating particular aspects of an example of a forward windowed decoding process associated with a CLDPC code.

FIG. 5 illustrates an example of a forward windowed decoding process 500. The forward windowed decoding process 500 may include adjusting (e.g., moving or "sliding") a position of a window W relative to the parity check matrix 142. For example, the window W may be adjusted to select a second set of target variables 504 after processing based on a first set of target variables 502. The first set of target variables 502 may be processed during a first set of one or more clock cycles of the ECC engine 132, and the second set of target variables 504 may be processed during a second set of one or more clock cycles of the ECC engine 132. The window W may correspond to the first window W1, the second window W2, the third window W3, or another window.

A window (e.g., the window W) may span a subset of rows and columns of a parity check matrix that corresponds to a CLDPC code. For example, FIG. 5 illustrates a CLDPC code with T=3 and a decoding window size of 4. In FIG. 5, a window boundary of the window W is indicated by a dashed line. During a particular clock cycle of an illustrative decoding process, a decoder (e.g., any of the decoders 136, 138, and 140) may process only the symbols within the window W. For example, at 510, the decoder may decode the first set of target variables 502.

After decoding the first set of target variables 502, the decoder may shift the window W (e.g., "down" and "right" by one section) to proceed and decode the next window, at 520. The forward windowed decoding process 500 may continue until the last decoding window, at 530, in which the decoder may attempt to correct all errors (and not just those within the first v-section of the last decoding window).

In an illustrative example, convergence of decoding of target variables is detected based on determining that a threshold number of one or more of the respective parity checks within the window is satisfied. The threshold may be set relatively low to increase probability of convergence, or the threshold may be set higher to reduce probability of non-convergence due to one or more undetected errors.

Figure 6:
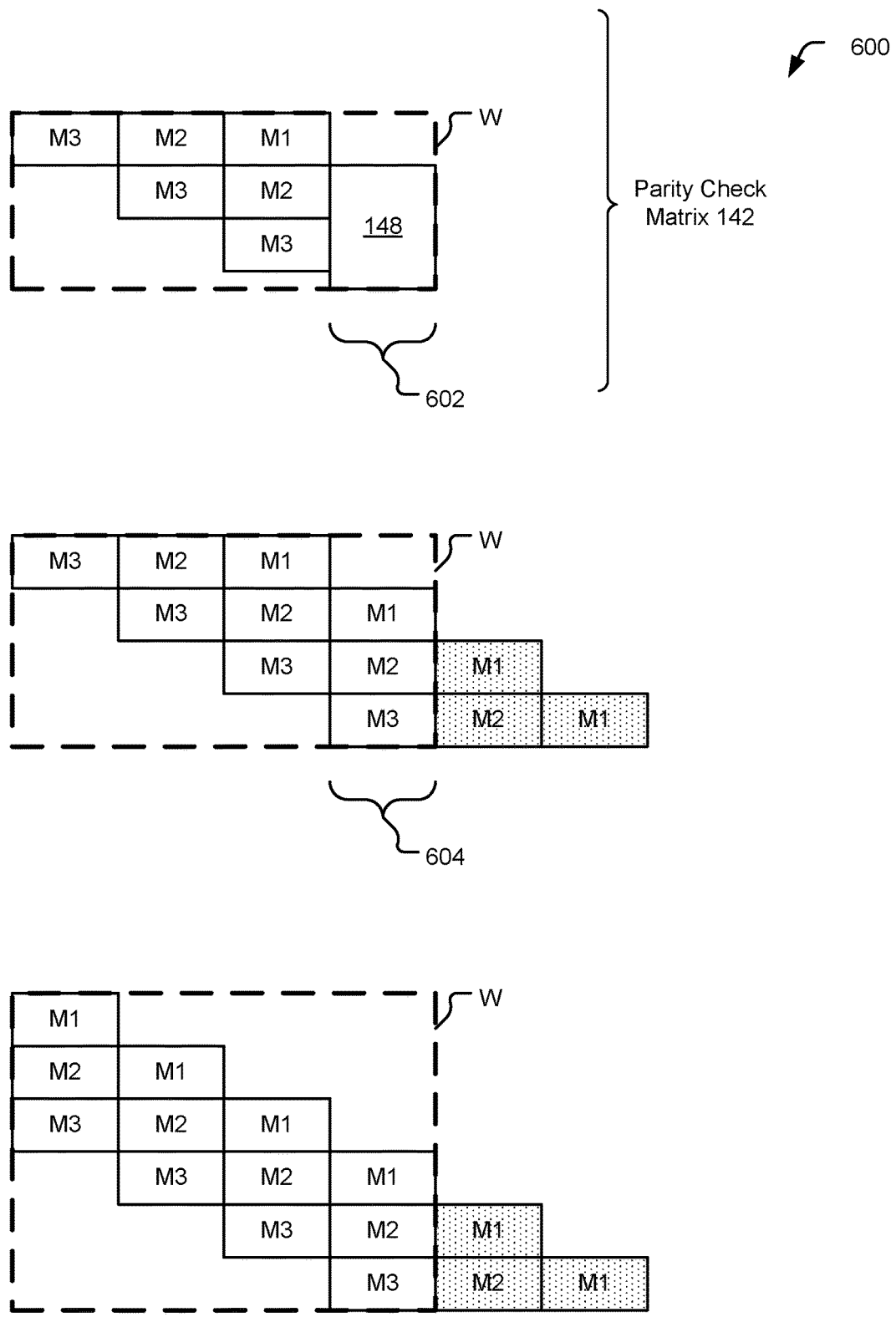
FIG. 6 is another diagram illustrating particular aspects of an example of a reverse windowed decoding process associated with a CLDPC code.

FIG. 6 illustrates another example of a reverse windowed decoding process 600. The reverse windowed decoding process 600 may include adjusting (e.g., moving or "sliding") a position of a window W relative to the parity check matrix 142. In the example of FIG. 6, the window W may be adjusted leftward (e.g., from rows and columns associated with greater indices to rows and columns associated with lower indices). For example, the window W may be adjusted to select a second set of target variables 604 processing based on a first set of target variables 602. The first set of target variables 602 may be processed during a first set of one or more clock cycles of the ECC engine 132, and the second set of target variables 604 may be processed during a second set of one or more clock cycles of the ECC engine 132. The window W may correspond to the first window W1, the second window W2, the third window W3, or another window.

In another windowed decoding process, a window may be moved "outside in" relative to the parity check matrix 142. For example, an "outside in" windowed decoding process may including adjusting a window from a leftmost set of columns to a rightmost set of columns and then to a next leftmost set of columns, etc. (e.g., so that the window advances from the ends of the parity check matrix 142 to the middle of the parity check matrix 142). In another example, the reverse windowed decoding process 600 may be used in conjunction with a forward windowed decoding process (e.g., the forward windowed decoding process 500) either to propagate extrinsic information in the event of decoding failure in a specific window, to speed up decoding, or both.

A windowed decoding process (e.g., a forward windowed decoding process, a reverse windowed decoding process, or an "outside in" windowed decoding process) may be performed to increase decoding throughput by processing portions of data (e.g., the representation 124 of the codeword 108) in parallel using multiple windows (e.g., the first window W1, the second window W2, and the third window W3). In some implementations the windows W1, W2, and W3 have different sizes. In other implementations, two or more windows may have a common size.

According to an illustrative example of a windowed decoding process, multiple columns of a parity check matrix may be processed in parallel such that no row of the parity check matrix is included in multiple windows simultaneously (or that no row is touched by multiple columns processed at the same time). According to a second example of a windowed decoding process, multiple v-sections of a parity check matrix may be processed in parallel if the multiple v-sections do not intersect entirely. To illustrate, if T=3, the second example may process v-sections having indices 1, 4, and 7 in parallel, may then process v-sections having indices 2, 5, and 8 in parallel, and then may process v-sections having indices 3, 6, and 9 in parallel (e.g., to conclude a decoding iteration of the windowed decoding process).

In some implementations, a window may have a non-uniform profile of variable node degree. For example, variables within the left section or sections of a window may have a greater variable node degree, and the variable node degree may decrease towards the end (or right) of the window. In this case, error correction capability may reduce (or "degrade") toward the right of the window. A spreading pattern (SP) may be used to determine (or control) an amount of the "degradation" of the error correction capability. For example, in some implementations, SP(1)=1 may correspond to a "weak" error correction capability. In other implementations, a relatively large value of SP(1) may weaken connectivity of the CLDPC chain and may reduce information transfer between decoding iterations associated with consecutive windows. In some implementations, SP=[2 1 1] (resulting in a variable node degree of four), SP=[3 1 1] (resulting in a variable node degree of five), or SP=[3 1 1 1] (resulting in a variable node degree of six).

Assuming decoding success for a particular window, values of the target variables may be determined, and upon transitioning to the next window, the values affect the satisfiability condition of neighboring checks (checks that neighbor the target variables) within the next window. As an example, consider the first two sections of the decoding window illustrated in the middle section of FIG. 5, at 520. Whether these checks need to be satisfied to a '0' or '1' value depends on the values of the variables decoded in the previous window, at 510. In some implementations, a size of a window is different than the value of T.

Upon successful decoding associated with a window, the subsequent window may start with the output values of the window for variables that were not target symbols of the current window. For example, upon successful decoding at 510 of FIG. 5, decoding may move from the first set of target variables 502 to the second set of target variables 504. This may save decoding time, since if a current window has been decoded successfully, then the remaining variables (which were not target symbols of the current window) have been partially corrected and are with high probability closer to being "correct." In connection with the illustrative three-decoder scheme of FIG. 1, in the event of decoding failure by the first decoder 136, one or more windows may be successfully decoded by the second decoder 138. In this case, a subsequent window may be decoded by the first decoder 136 (to reduce power consumption as compared to decoding of the subsequent window by the second decoder 138). Alternatively or in addition, in the event of decoding failure by the second decoder 138, one or more windows may be successfully decoded by the third decoder 140, and a subsequent window may be decoded by the second decoder 138 (to reduce power consumption as compared to decoding of the subsequent window by the third decoder 140). Thus, a "stronger" decoder (e.g., the second decoder 138 or the third decoder 140) may initialize data for a "weaker" decoder (e.g., the first decoder 136 or the second decoder 138, respectively).

Figure 7:
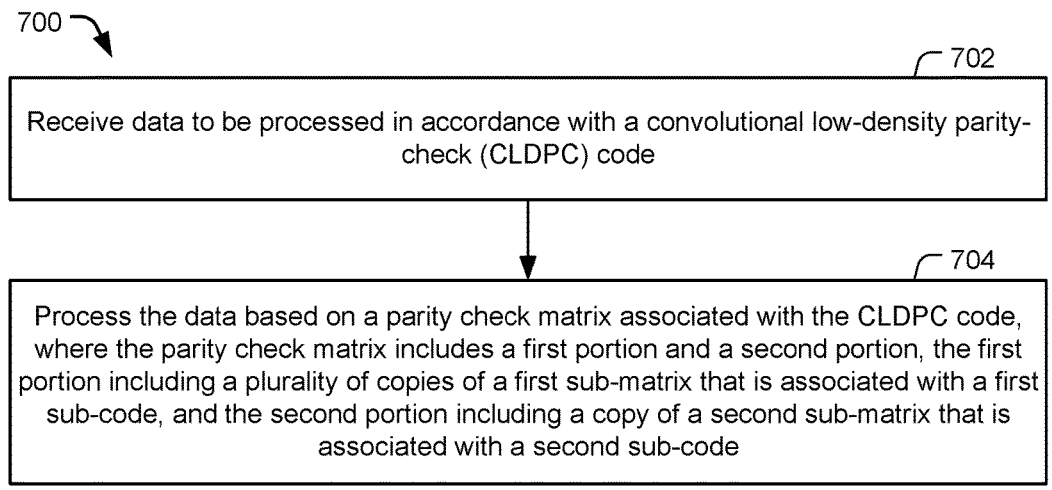
FIG. 7 is a flow chart of an illustrative example of a method of processing data based on a CLDPC code.

Alternatively or in addition, a different window size may be assigned per type of decoder. For example, a largest window size may be selected for a decoder associated with a lowest power consumption (e.g., the first decoder 136), and a smallest window size be selected for a decoder associated with a highest power consumption (e.g., third decoder 140). Thus, performance of the first decoder 136 may be determined based on a window size of the first decoder 136, and the third decoder 140 may be associated with a tradeoff between obtaining better correction capability (by increasing the window size) and lower cost (by decreasing the window size). Thus, decoder performance may be decoupled from an error correction capability/cost tradeoff Referring to FIG. 7, a particular illustrative example of a method is depicted and generally designated 700. The method 700 may be performed at a device, such as at the data storage device 102 of FIG. 1.

The method 700 includes receiving data to be processed in accordance with a CLDPC code, at 702. For example, the data storage device 102 may receive the data 160 from the device 180. As another example, the controller 130 may receive the representation 124 of the codeword 108 from the memory device 103.

The method 700 further includes processing the data based on a parity check matrix (e.g., the parity check matrix 142) associated with the CLDPC code, at 704. The parity check matrix includes a first portion (e.g., the first portion 144) and a second portion (e.g., the second portion 148). The first portion includes a plurality of copies (e.g., the plurality of copies 146) of a first sub-matrix (e.g., the first sub-matrix 152) that is associated with a first sub-code, and the second portion includes a copy of a second sub-matrix (e.g., the second sub-matrix 156) that is associated with a second sub-code. In an illustrative example, processing the data includes encoding the data to generate a codeword, such as the codeword 108. In another example, processing the data includes decoding the data, such as by decoding the representation 124 of the codeword 108 to generate the data 160.

Figure 8:
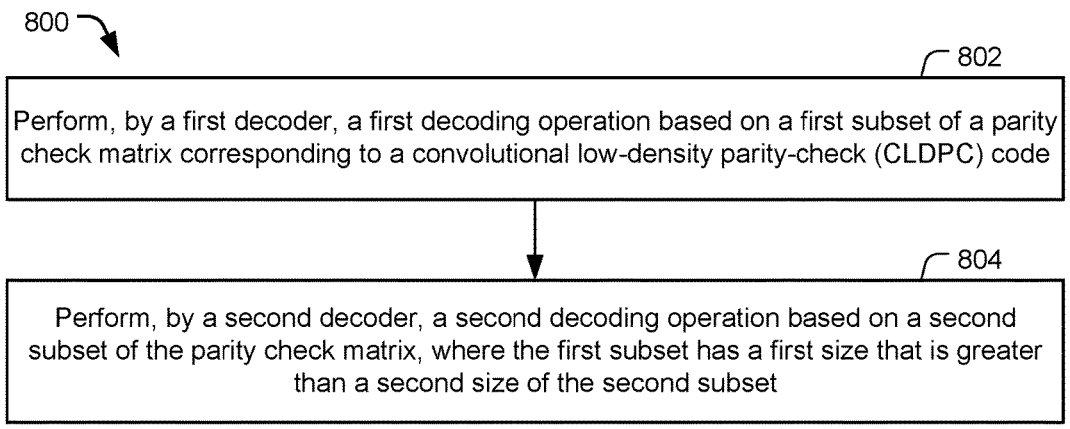
FIG. 8 is a flow chart of another illustrative example of a method of processing data based on a CLDPC code.

Referring to FIG. 8, a particular illustrative example of a method is depicted and generally designated 800. The method 800 may be performed at a device, such as at the data storage device 102 of FIG. 1.

The method 800 includes performing, by a first decoder, a first decoding operation based on a first subset of a parity check matrix corresponding to a CLDPC code, at 802. For example, the first decoder may correspond to the first decoder 136, the first subset may correspond to the first window W1, and the parity check matrix may correspond to the parity check matrix 142.

The method 800 further includes performing, by a second decoder, a second decoding operation based on a second subset of the parity check matrix, at 804. The first subset has a first size that is greater than a second size of the second subset. To illustrate, the second decoder may correspond to the second decoder 138, the second subset may correspond to the second window W2, and a first size of the first window W1 may be greater than a second size of the second window W2.

Figure 9:
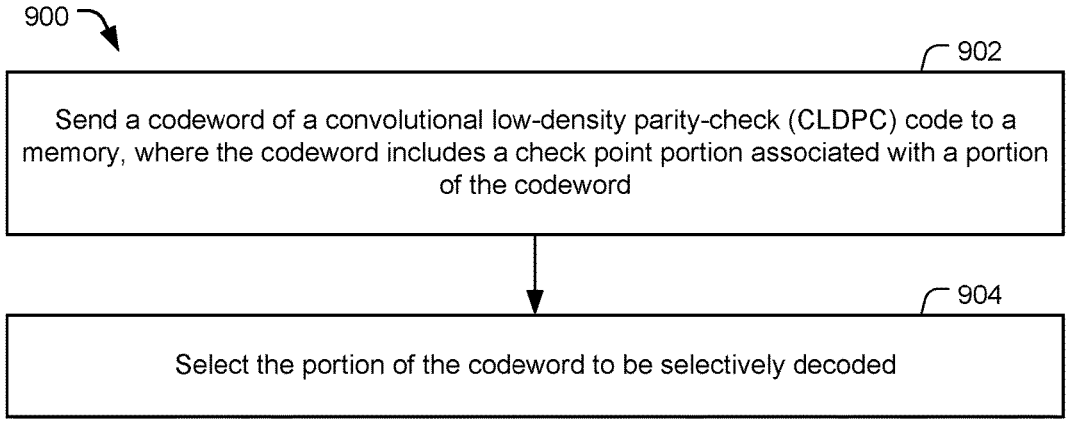
FIG. 9 is a flow chart of an illustrative example of a method of accessing data associated with a CLDPC code.

Referring to FIG. 9, a particular illustrative example of a method is depicted and generally designated 900. The method 900 may be performed at a device, such as at the data storage device 102 of FIG. 1.

The method 900 includes sending a codeword of a CLDPC code to a memory, at 902. The codeword includes a check point portion associated with a portion of the codeword. For example, the codeword 108 may include the first check point portion 114 (e.g., error correcting information) associated with the header 110 and the first data portion 112.

The method 900 may also include selecting the portion of the codeword to be selectively decoded, at 904. As an example, the controller 130 may selectively decode the header 110 and the first data portion 112 using the first check point portion 114 (e.g., without decoding one or more other portions of the codeword). Further, the controller 130 may provide decoded data corresponding to the portion to the device 180 without providing one or more other portions of the codeword to the device 180, prior to receiving one or more other portion of the codeword from the memory, or both.

Figure 10:
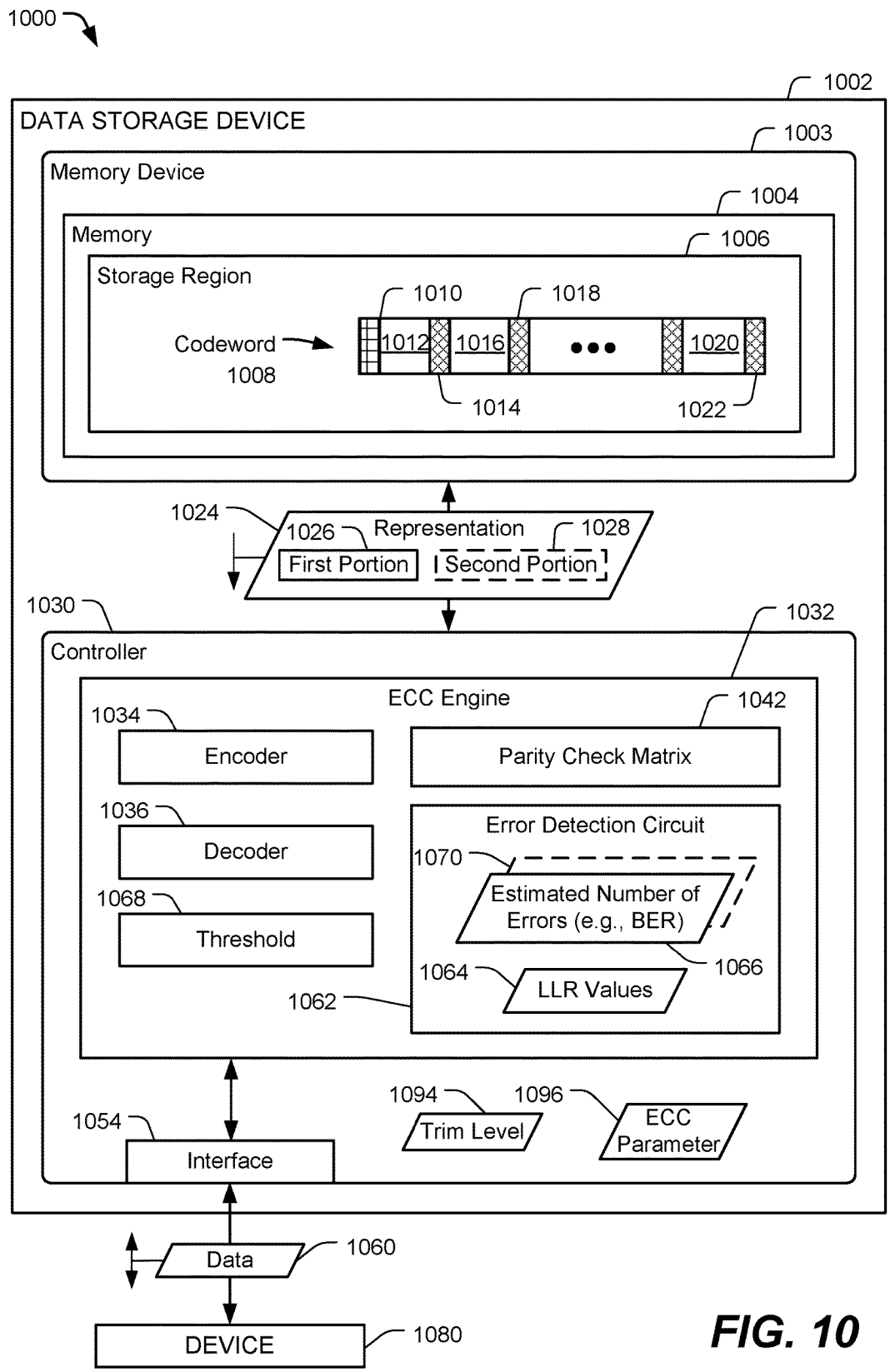
FIG. 10 is a diagram of another particular illustrative example of a system including a data storage device that is configured to operate based on a CLDPC code.

Referring to FIG. 10, a particular illustrative example of system is depicted and generally designated 1000. The system 1000 includes a data storage device 1002 and a device 1080 (e.g., a host device or an access device). The data storage device 1002 includes a memory device 1003 and a controller 1030. The controller 1030 is coupled to the memory device 1003. In some examples, the system 1000 corresponds to the system 100, the data storage device 1002 corresponds to the data storage device 102, and the device 1080 corresponds to the device 180. The memory device 1003 may correspond to the memory device 103, and the controller 1030 may correspond to the controller 130.

The memory device 1003 includes a memory 1004, such as a non-volatile array of storage elements included in one or more memory dies. The memory 1004 may include a flash memory (e.g., a NAND flash memory) or a resistive memory, such as a resistive random access memory (ReRAM), as illustrative examples. The memory 1004 may correspond to the memory 104, as an illustrative example.

The memory 1004 includes one or more regions of storage elements, such as a storage region 1006 (e.g., the storage region 106). An example of the storage region 1006 is a block, such as a NAND flash erase group of storage elements, or a group of resistance-based storage elements in a ReRAM implementation. Another example of the storage region 1006 is a word line of storage elements (e.g., a word line of NAND flash storage elements or a word line of resistance-based storage elements). The storage region 1006 may have a single-level-cell (SLC) configuration, a multi-level-cell (MLC) configuration, or a tri-level-cell (TLC) configuration, as illustrative examples. Each storage element of the storage region 1006 may be programmable to a state (e.g., a threshold voltage in a flash configuration or a resistive state in a resistive memory configuration) that indicates one or more values. As an example, in an illustrative TLC scheme, a storage element of the storage region 1006 may be programmable to a state that indicates three values. As an additional example, in an illustrative MLC scheme, a storage element of the storage region 1006 may be programmable to a state that indicates two values.

The controller 1030 may include an interface 1054, such as a host interface or an access device interface. The interface 1054 is configured to receive data 1060 from the device 1080 in connection with a request for write access to the memory 1004. The interface 1054 is configured to provide the data 1060 to the device 1080 in connection with a request for read access to the memory 1004.

The controller 1030 may further include an error correcting code (ECC) engine 1032 (e.g., the ECC engine 132). The ECC engine 1032 may include an encoder 1034 (e.g., the encoder 134), a decoder 1036 (e.g., one or more of the decoders 136, 138, and 140), and an error detection circuit 1062. The decoder 1036 may be coupled to the error detection circuit 1062.

The ECC engine 1032 is configured to operate based on a convolutional low-density parity-check (CLDPC) code. For example, the ECC engine 1032 may be configured to process the data 1060 based on a parity check matrix 1042 (e.g., the parity check matrix 142) associated with a CLDPC code. The parity check matrix 1042 may include the first portion 144 and the second portion 148 of FIG. 1. The parity check matrix 1042 may have an upper right corner of zero values. For example, the parity check matrix 1042 may include the upper right corner of zero values 190 of FIG. 2.

During operation, the controller 1030 may receive the data 1060 from the device 1080. The controller 1030 may process the data 1060 in accordance with a CLDPC code. For example, controller 1030 may input the data 1060 to the ECC engine 1032 to be encoded by the encoder 1034 to generate one or more codewords associated with the CLDPC code, such as a codeword 1008 (e.g., the codeword 108). The codeword 1008 may be a CLDPC codeword. The encoder 1034 may be configured to encode the data 1060 based on the parity check matrix 1042 or based on another matrix that is associated with the parity check matrix 1042 (e.g., using a generator matrix that is based on the parity check matrix 1042).

In some implementations, the encoder 1034 is configured to insert one or more check point portions in the codeword 1008 during an encoding process. For example, the encoder 1034 may be configured to insert a first check point portion 1014 between a first data portion 1012 and a second data portion 1016. As another example, the encoder 1034 may be configured to insert a second check point portion 1018 between the second data portion 1016 and a third data portion 1020. As an additional example, the encoder 1034 may be configured to insert a third check point portion 1022 after the third data portion 1020. FIG. 10 also depicts that the codeword 1008 may include metadata, such as a header 1010. In some examples, the data portions 1012, 1016, and 1020, the check point portions 1014, 1018, and 1022, and the header 1010 correspond to the data portions 112, 116, and 120, the check point portions 114, 118, and 122, and the header 110 of FIG. 1, respectively.

In an illustrative example, the first check point portion 1014 includes first error correcting information (or first error detecting information), such as a first cyclic redundancy check (CRC) associated with the header 1010 and the first data portion 1012. The second check point portion 1018 may include second error correcting information (or second error detecting information), such as a second CRC associated with the second data portion 1016. The third check point portion 1022 may include third error correcting information, such as a third CRC associated with the third data portion 1020.

The controller 1030 is configured to send the codeword 1008 to the memory device 1003 to be stored at the memory 1004. The memory 1004 is configured to store the codeword 1008. To illustrate, the controller 1030 may send a write command to cause the memory device 1003 to store the codeword 1008 to the storage region 1006. In an illustrative example of a multiple-bits-per-cell configuration (e.g., an MLC configuration or a TLC configuration), a fold operation may be performed to write the codeword 1008 and one or more other codewords to the storage region 1006, such as by "folding" multiple codewords into a word line group of storage elements included in the storage region 1006.

The controller 1030 is configured to access a representation 1024 of at least a portion of the codeword 1008, such as by sending a read command to the memory device 1003. As an example, the controller 1030 may cause the memory device 1003 to access the representation 1024 in connection with a management operation, such as memory management operation (e.g., to determine a pass or fail status of a write operation to write the codeword 1008 to the storage region 1006, such as a fold operation, as an illustrative example) or a health management operation (e.g., to determine an amount of "wear" at the storage region 1006 as a result of program/erase cycles (PECs) at the storage region 1006, as an illustrative example). As another example, the controller 1030 may cause the memory device 1003 to access the representation 1024 in response to a request for read access from the device 1080.

The representation 1024 may correspond to a version of the codeword 1008 that differs from the codeword 1008 due to one or more errors. The representation 1024 includes a first portion 1026. For example, the first portion 1026 may correspond to a representation of one or more of the header 1010, the first data portion 1012, or the first check point portion 1014. As another example, the first portion 1026 may correspond to a representation of one or more of the second data portion 1016 or the second check point portion 1018. As an additional example, the first portion 1026 may correspond to a representation of one or more of the third data portion 1020 or the third check point portion 1022.

The first portion 1026 may include a subset of bits of the codeword 1008. To illustrate, the first portion 1026 may include a first number of bits, and the codeword 1008 may include a second number of bits that is greater than the first number of bits.

The memory device 1003 may provide the representation 1024 to the controller 1030. The controller 1030 is configured to receive the representation 1024 from the memory device 1003 and to input the representation 1024 (or the first portion 1026 of the representation 1024) to the error detection circuit 1062.

The error detection circuit 1062 is configured to determine an estimated number of errors 1066 associated with the first portion 1026. An example of the estimated number of errors 1066 is a syndrome weight associated with the first portion 1026. As an illustrative example, the error detection circuit 1062 may be configured to determine the estimated number of errors 1066 based on a number of unsatisfied checks associated with the first portion 1026. To further illustrate, the parity check matrix 1042 may specify a set of check equations in accordance with a CLDPC code used to generate the codeword 1008. The error detection circuit 1062 may be configured to determine a number of unsatisfied check equations based on the first portion 1026. In some implementations, determining the estimated number of errors 1066 may include determining (or estimating) a bit error rate (BER) of the first portion 1026.

In at least one example, the controller 1030 is configured to initiate one or more management operations at the memory 1004 based on the estimated number of errors 1066. In some implementations, the controller 1030 is configured to compare the estimated number of errors 1066 to a threshold 1068. The controller 1030 may be configured to initiate the one or more management operations in response to determining that the estimated number of errors 1066 satisfies the threshold 1068 (e.g., if the estimated number of errors 1066 is greater than or is greater than or equal to the threshold 1068).

The one or more management operations may include a memory management operation associated with the storage region 1006. An example of a memory management operation is a read scrub operation targeting the storage region 1006. To illustrate, in response to determining that the estimated number of errors 1066 satisfies the threshold 1068, the controller 1030 may read a representation of the codeword 1008 (e.g., the representation 1024 or another representation) and may error correct the representation using the decoder 1036 to generate an error corrected version of the codeword 1008. The read scrub operation may also include reprogramming the error corrected version of the codeword 1008 to the memory 1004. For example, the error corrected version of the codeword 1008 may be reprogrammed to another storage region of the memory 1004 (e.g., in connection with a NAND flash implementation of the memory 1004, as an illustrative example). In other implementations, the error corrected version of the codeword 1008 may be reprogrammed to the storage region 1006 (e.g., using a "write in place" operation in connection with a resistive memory implementation of the memory 1004, as an illustrative example).

Another example of a memory management operation is detecting a status of a write operation to write the codeword 1008 to the storage region 1006. To illustrate, if the storage region 1006 has a multiple-bits-per-cell configuration (e.g., an MLC configuration or a TLC configuration), a fold operation may be performed to write the codeword 1008 and one or more other codewords to the storage region 1006. In this case, the memory management operation may include detecting a status (e.g., detecting success or failure) of the fold operation based on the estimated number of errors 1066 satisfying the threshold 1068. In an illustrative example, the controller 1030 is configured to initiate an enhanced post-write read (EPWR) operation in response to initiating a fold operation at the memory 1004. In this case, the representation 1024 may be sensed in connection with the EPWR operation.

Alternatively or in addition, detecting the status of the write operation may include determining whether a write abort occurred during programming of the codeword 1008 to the storage region 1006. To illustrate, if a power down event or a power failure event occurs during a write operation to program the codeword 1008 to the storage region 1006, the first portion 1026 may include a relatively large number of errors. In this case, the memory management operation may include detecting a status (e.g., detecting success or failure) of the write operation based on the estimated number of errors 1066 satisfying the threshold 1068.

In response to detecting the status of the write operation based on the estimated number of errors 1066 satisfying the threshold 1068, the memory management operation may further include reprogramming the codeword 1008 at the memory 1004. For example, the controller 1030 may reprogram the codeword 1008 in response to detecting failure of the write operation (e.g., based on detecting failure of a fold operation or in response to detecting a write abort). To illustrate, the controller 1030 may sense and error correct (using the decoder 1036) a representation of the codeword 1008 and may reprogram an error corrected version of the codeword 1008 to the memory 1004. In some implementations, the error corrected version of the codeword 1008 may be reprogrammed to another storage region (e.g., in connection with a NAND flash implementation of the memory 1004, as an illustrative example). In other implementations, the error corrected version of the codeword 1008 may be reprogrammed to the storage region 1006 (e.g., using a "write in place" operation in connection with a resistive memory implementation of the memory 1004, as an illustrative example).

Alternatively or in addition to a memory management operation, the one or more management operations may include a health management operation associated with the storage region 1006, another management operation, or a combination thereof. An example of a health management operation is adjusting a trim level 1094 associated with the storage region 1006. In some implementations, the trim level 1094 indicates one or more programming characteristics associated with write operations performed at the storage region 1006. For example, the trim level 1094 may indicate a number of programming pulses to be applied to the storage region 1006 (e.g., prior to initiating a write verification process at the storage region 1006), a voltage level of one or more programming pulses applied to the storage region 1006, a duration (or "width") of one or more programming pulses applied to the storage region 1006, one or more other programming characteristics, or a combination thereof In response to detecting a relatively large estimated number of errors 1066 (e.g., where the estimated number of errors 1066 satisfies the threshold 1068), the controller 1030 may adjust the trim level 1094 more "conservatively" to increase reliability of data stored at the storage region 1006. For example, the controller 1030 may adjust the trim level 1094 to increase a number of programming pulses applied at the storage region 1006, to increase a voltage level of one or more programming pulses applied at the storage region 1006, or to increase a duration of one or more programming pulses associated with the storage region 1006.

In response to detecting a relatively small estimated number of errors 1066 (e.g., where the estimated number of errors 1066 fails to satisfy the threshold 1068), the controller 1030 may adjust the trim level 1094 more "aggressively" to increase speed of write operations performed at the storage region 1006, to reduce power consumption associated with write operations performed at the storage region 1006, or both. For example, the controller 1030 may adjust the trim level 1094 to decrease a number of programming pulses applied at the storage region 1006, to decrease a voltage level of one or more programming pulses applied at the storage region 1006, or to decrease a duration of one or more programming pulses applied at the storage region 1006.

Another example of a health management operation is initiating a wear leveling operation associated with the storage region 1006. A wear leveling operation may include copying data from a less reliable (or more frequently used) storage region of the memory 1004 to a more reliable (or less frequently used) storage region of the memory 1004 (e.g., to "even out" wearing of the storage regions). An example of a wear leveling operation is an adaptive wear leveling (AWL) operation that is performed based at least in part on the estimated number of errors 1066. To illustrate, if the estimated number of errors 1066 fails to satisfy the threshold 1068, the controller 1030 may determine that the storage region 1006 is more "strong," and if the estimated number of errors 1066 satisfies the threshold 1068, the controller 1030 may determine that the storage region 1006 is more "weak." The AWL operation may specify that "stronger" storage regions of the memory 1004 are to be used more frequently than (or sooner than) "weaker" storage regions of the memory 1004. In some implementations, the controller 1030 may include a table that ranks indications of storage regions of the memory 1004 based on estimated numbers of errors. In this case, the controller 1030 may update the table to indicate that the storage region 1006 is associated with the estimated number of errors 1066. The controller 1030 may access the table in connection with the AWL operation.

Another example of a health management operation is adjusting an ECC parameter 1096 associated with the storage region 1006. For example, the ECC parameter 1096 may indicate a code rate (e.g., a ratio of data bits to a total number of bits) used to encode data written to the storage region 1006. To illustrate, if the estimated number of errors 1066 fails to satisfy the threshold 1068, the controller 1030 may increase the code rate, and if the estimated number of errors 1066 satisfies the threshold 1068, the controller 1030 may decrease the code rate.

Alternatively or in addition to initiating one or more management operations, the controller 1030 may be configured to decode the representation 1024 of the codeword 1008 based on the estimated number of errors 1066. The decoder 1036 may be configured to receive an indication of the estimated number of errors 1066 from the error detection circuit 1062 and to use the estimated number of errors 1066 during decoding of the representation 1024.

For example, the ECC engine 1032 may be configured to determine a set of log-likelihood ratio (LLR) values 1064 based on the estimated number of errors 1066 prior to initiating decoding of the representation 1024. The decoder 1036 may be configured to receive the set of LLR values 1064 from the error detection circuit 1062 and may be configured to decode the representation 1024 using the set of LLR values 1064 (e.g., in connection with a soft decode operation).

As another example, decoding the second portion may include flipping one or more bits of the representation 1024 based on the estimated number of errors 1066. To illustrate, in some implementations, the ECC engine 1032 may be configured to flip one or more bits of the representation 1024 (e.g., prior to inputting the representation 1024 to the decoder 1036) in response to detecting that one or more bit flipping thresholds are satisfied. As an example, a particular bit of the representation 1024 may be associated with a particular number of unsatisfied check equations associated with the parity check matrix 1042. If flipping the particular bit (e.g., from a "0" value to a "1" value, or vice versa) causes a threshold number of check equations to be satisfied, the ECC engine 1032 may flip the value of the particular bit. In an illustrative example, the ECC engine 1032 may use the estimated number of errors 1066 to decide a "borderline" cases (e.g., where the ECC engine 1032 determines that a probability of the bit being correct is approximately equal to a probability of the bit being incorrect). In this case, the ECC engine 1032 may flip the bit in response to the estimated number of errors 1066 satisfying the threshold 1068 or may refrain from flipping the bit in response to the estimated number of errors 1066 satisfying the threshold 1068.

The controller 1030 may be configured to determine the estimated number of errors 1066 prior to initiating a decode operation to decode the first portion 1026 or without initiating a decode operation to decode the first portion 1026. For example, the controller 1030 may initiate a management operation without accessing and decoding a "full" representation 1024 of the codeword 1008. In other cases, the controller 1030 may access and decode the "full" representation 1024 (e.g., in response to a request for read access from the device 1080). To further illustrate, the controller 130 may input the first portion 1026 to the error detection circuit 1062 to determine the estimated number of errors 1066 prior to inputting the first portion 1026 to the decoder 1036 or without inputting the first portion 1026 to the decoder 1036.

In an illustrative example, the decoder 1036 is configured to perform the decode operation using a windowed decoding technique associated with a decoding window size. The decoding window size may correspond to any of the first window W1, the second window W2, the third window W3 described with reference to FIG. 1, as illustrative examples. The first portion 1026 may have a size corresponding to a decoding window used by the decoder.

In an illustrative implementation, the controller 1030 is configured to set a size (e.g., a number of bits) of the first portion 1026. For example, a smaller size of the first portion 1026 may enable the first portion 1026 to be sensed and transferred to the controller 1030 more rapidly and/or using less power as compared to a larger size of the first portion 1026. In some cases, a smaller size of the first portion 1026 may result in a "noisier" (or less accurate) estimated number of errors 1066. A larger size of the first portion 1026 may increase accuracy of the estimated number of errors 1066 (while increasing cycles and/or power used to sense and transfer the first portion 1026 to the controller 1030). The controller 1030 may be configured to set the size based on one or more criteria, such as a power consumption mode of the data storage device 1002, as an illustrative example.

In some examples, the first portion 1026 has a leftmost position within the codeword 1008. To illustrate, the first portion 1026 may correspond to a representation of one or more of the header 1010, the first data portion 1012, or the first check point portion 1014. In other examples, the first portion 1026 has a rightmost position within the codeword 1008. To illustrate, the first portion 1026 may correspond to a representation of one or more of the third data portion 1020 or the third check point portion 1022. In other examples, the first portion 1026 is selected from a leftmost position of the codeword 1008 and from a rightmost position of the codeword 1008. In this case, the first portion 1026 may correspond to a representation of two or more of the header 1010, the first data portion 1012, the first check point portion 1014, the third data portion 1020, and the third check point portion 1022.

In some implementations, the ECC engine 1032 is configured to compare estimated numbers of errors of different portions of the representation 1024 and to perform one or more remedial operations in response to detecting that a difference between the estimated numbers of errors satisfies a threshold. To illustrate, the representation 1024 may optionally further include a second portion 1028. In an illustrative example, the first portion 1026 corresponds to a leftmost portion of the codeword 1008, and the second portion 1028 corresponds to a rightmost portion of the codeword 1008 (or vice versa).

The controller 1030 may determine a second estimated number of errors 1070 associated with the second portion 1028. For example, the controller 1030 may input the second portion 1028 to the error detection circuit 1062 to determine the second estimated number of errors 1070.

The controller 1030 may determine a difference between the estimated number of errors 1066 and the second estimated number of errors 1070. In a non-limiting illustrative example, the controller 1030 includes a comparator circuit configured to determine the difference. The controller 1030 may compare the difference to a threshold (e.g., the threshold 1068 or another threshold). The controller 1030 may be configured to cause the memory device 1003 to re-sense the representation 1024 in response to determining that the difference satisfies the threshold. For example, the controller 1030 may detect an error (e.g., a read operation error in reading the representation 1024 or a transfer error in transferring the representation 1024 from the memory device 1003 to the controller 1030) in response to determining that the difference satisfies the threshold.

One or more aspects described with reference to FIG. 10 may improve operation of a data storage device. For example, use of a CLDPC code may enable a "fast" estimation of a number of errors of a portion (e.g., the first portion 1026) of the codeword 1008. By estimating the number of errors using a fast technique, an amount of information sent from the memory 1004 to the controller 1030 may be reduced. Alternatively or in addition, efficiency of a decoding process may be improved.

Figure 11:
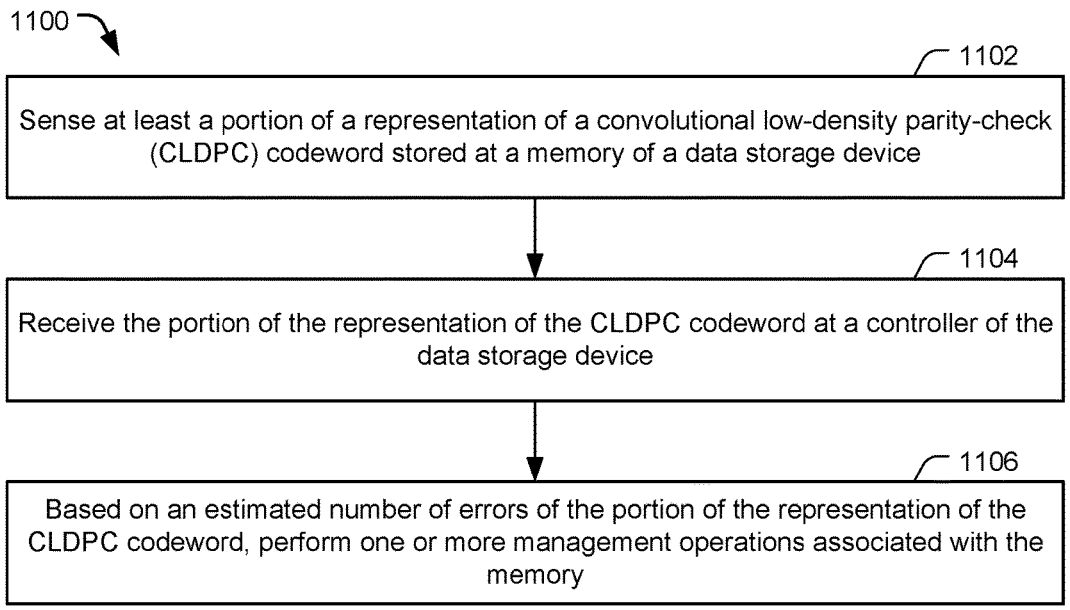
FIG. 11 is a flow chart of an illustrative example of a method of operation of a data storage device, such as the data storage device of FIG. 10.

Referring to FIG. 11, a method of operation of a data storage device is depicted and generally designated 1100. The method 1100 may be performed at the data storage device 102, the data storage device 1002, or both.

The method 1100 includes sensing at least a portion of a representation of a CLDPC codeword stored at a memory of a data storage device, at 1102. For example, the representation 1024 of the codeword 1008 may be sensed from the memory 1004 of the data storage device 1002. The representation 1024 includes the first portion 1026.

The method 1100 further includes receiving the portion of the representation of the CLDPC codeword at a controller of the data storage device, at 1104. For example, the controller 1030 may receive the representation 1024 from the memory device 1003.

The method 1100 further includes performing, based on an estimated number of errors of the portion of the representation of the CLDPC codeword, one or more management operations associated with the memory, at 1106. The estimated number of errors may correspond to the estimated number of errors 1066, and the one or more management operations may include one or more of the management operations described with reference to FIG. 10, as illustrative examples.

Figure 12:
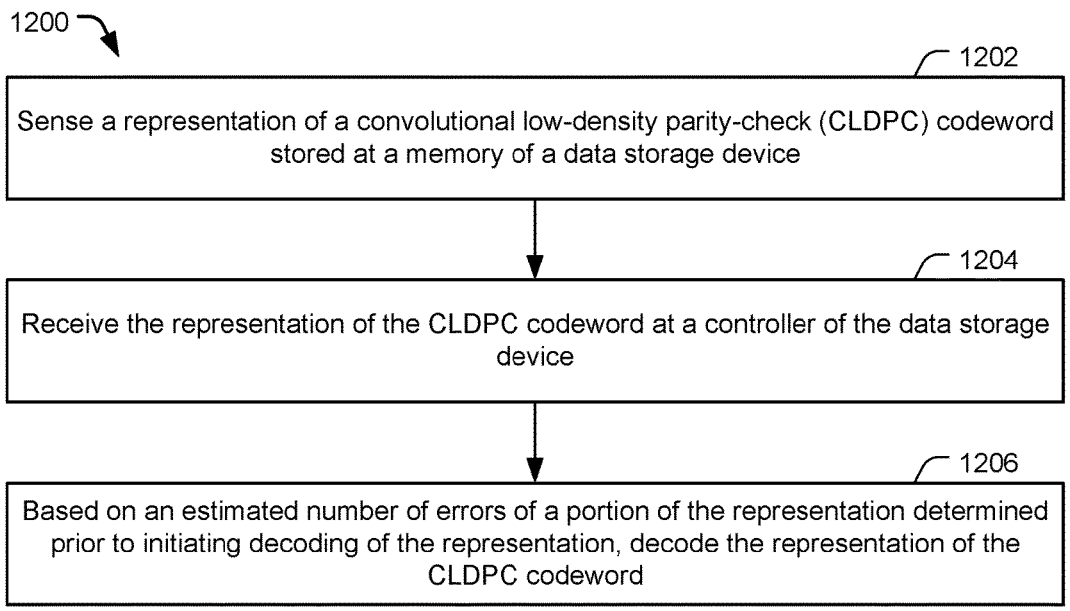
FIG. 12 is a flow chart of another illustrative example of a method of operation of a data storage device, such as the data storage device of FIG. 10.

Referring to FIG. 12, a method of operation of a data storage device is depicted and generally designated 1200. The method 1200 may be performed at the data storage device 102, the data storage device 1002, or both.

The method 1200 includes sensing a representation of a CLDPC codeword stored at a memory of a data storage device, at 1202. For example, the representation 1024 of the codeword 1008 may be sensed from the memory 1004 of the data storage device 1002. The representation 1024 includes the first portion 1026.

The method 1200 further includes receiving the representation of the CLDPC codeword at a controller of the data storage device, at 1204. For example, the controller 1030 may receive the representation 1024 from the memory device 1003.

The method 1200 further includes decoding, based on an estimated number of errors of a portion of the representation determined prior to initiating decoding of the representation, the representation of the CLDPC codeword, at 1206. The estimated number of errors may correspond to the estimated number of errors 1066, and decoding the representation may be performed in accordance with one or more techniques described with reference to FIG. 10, as illustrative examples.

Convolutional LDPC codes are well-suited to address design challenges that can occur when a minimal write unit size of a memory is larger than a minimal read unit size of the memory. For example, in a NAND flash memory, the read granularity may be 4 kilobytes (4 kB), and the write granularity may be 32 kB (e.g., a page size of a memory die). To further illustrate, an ECC code may be designed to provide data protection for a data storage device in which the minimal write unit is 32 kB and in which the read unit is 32 kB in a sequential read mode. In a random read mode, the read unit may be 4 kB and only a single 4 kB read unit may be read from the memory (although an entire 32 kB read unit may be read in case the 4 kB read unit is undecodable). An example of a data storage device including such an ECC code is described with reference to FIG. 13.

Figure 13:
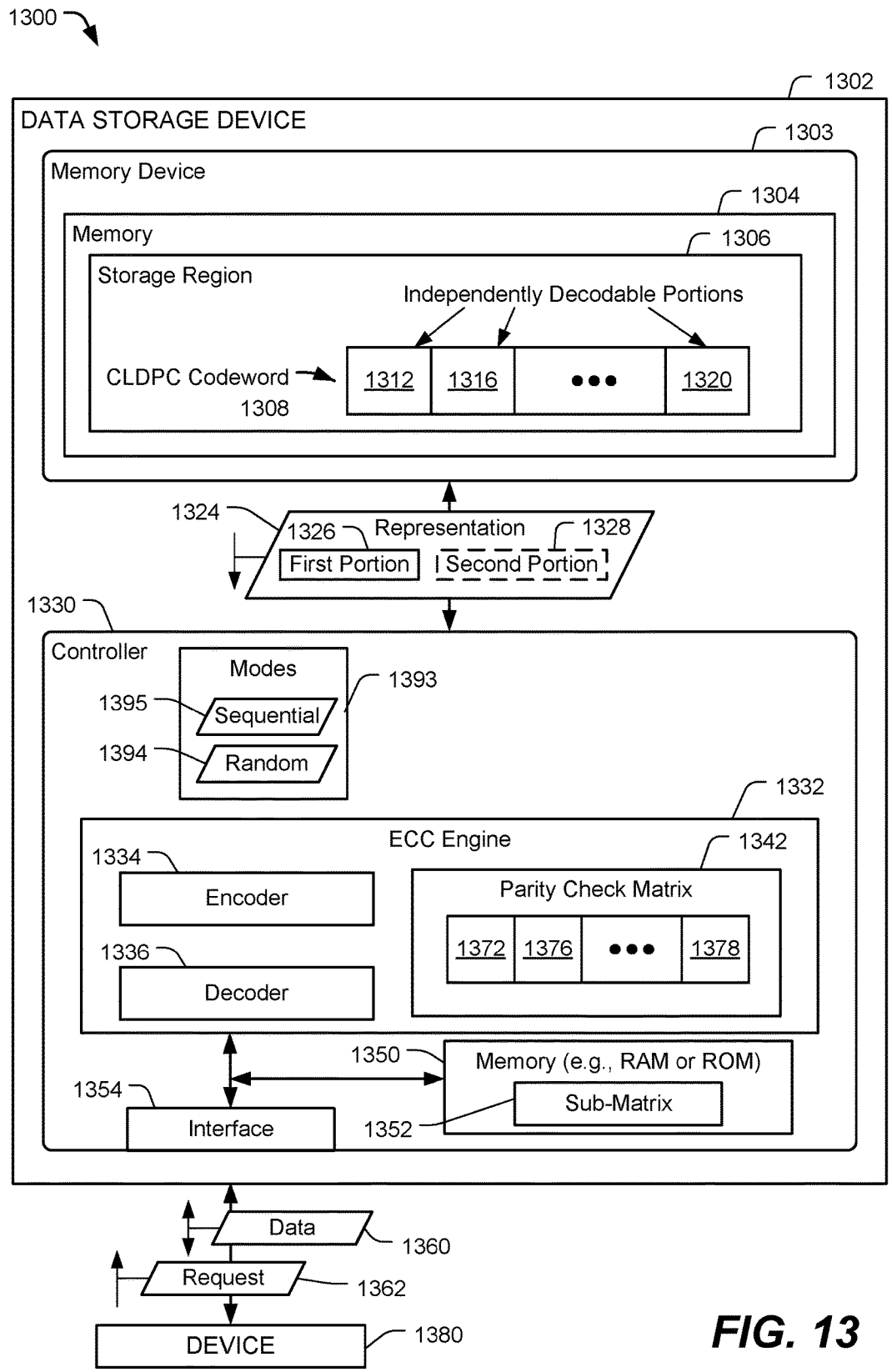
FIG. 13 is a diagram of another particular illustrative example of a system including a data storage device that is configured to operate based on a CLDPC code.

Referring to FIG. 13, a particular illustrative example of system is depicted and generally designated 1300. The system 1300 includes a data storage device 1302 and a device 1380 (e.g., a host device or an access device). The data storage device 1302 includes a memory device 1303 coupled to a controller 1330. In some examples, the system 1300 corresponds to the system 1000 of FIG. 10, the data storage device 1302 corresponds to the data storage device 1002, and the device 1380 corresponds to the device 1080. The memory device 1303 may correspond to the memory device 1003, and the controller 1330 may correspond to the controller 1030.

The memory device 1303 includes a memory 1304 having a representative storage region 1306. For example, the memory 1304 may correspond to the memory 1004 of FIG. 10, and the storage region 1306 may correspond to the storage region 1006.

The memory 1304 is configured to store a codeword of a convolutional low-density parity check (CLDPC) code, such as a codeword 1308 of a CLDPC code. The codeword 1308 has a first size, such as 32 kB to align with a write granularity of the memory 1304. The codeword 1308 includes multiple portions that are independently decodable and that have a second size, such as 4 kB to align with a read granularity of the memory 1304. For example, the codeword 1308 includes a first portion 1312, a second portion 1316, and one or more other portions including a final portion 1320. Each of the portions 1312-1320 is decodable independently of the other portions of the codeword 1308. In addition, the codeword 1308 (including all of the portions 1312-1320) is decodable as a single codeword having a greater error correction capability than the combined error correction capacity of the individual portions 1312-1320, as described further with reference to FIG. 14A and FIG. 14B.

The controller 1330 includes an ECC engine 1332, a memory 1350, and an interface 1354. For example, the ECC engine 1332 may correspond to the ECC engine 1032 of FIG. 10, the memory 1350 may correspond to the memory 150 of FIG. 1, and the interface 1354 may correspond to the interface 1054. The ECC engine 1332 includes a CLDPC encoder 1334 that is configured to encode the codeword 1308, a CLDPC decoder 1336 that is configured to decode the codeword 1308 or a portion of the multiple portions 1312-1320 based on whether a sequential read or a random read is being performed, and a parity check matrix 1342. The encoder 1334 may correspond to the encoder 1034 of FIG. 10, and the decoder 1336 may correspond to the decoder 1036 of FIG. 10.

The controller 1330 is configured to operate in multiple modes 1393, including a random mode 1394 and sequential mode 1395. In the random mode 1394, data is retrieved from the memory 1304 in units corresponding to read segments. In the sequential mode 1395, data is retrieved from the memory 1304 in units corresponding to write segments. To illustrate, a write segment may be larger than a read segment. In a particular implementation, a total size of the codeword 1308 corresponds to the size of a write segment, and a size of each of the independently decodable portions 1312-1320 corresponds to the size of a read segment. Hence, the codeword 1308 may be sized to correspond to a smallest unit of data that can be written to the memory 1304, while each of the portions 1312-1320 may be sized to correspond to a smallest unit of data that can be read from the memory 1304. After decoding, the requested data is provided to the device 1380 as data 1360.

In the random mode 1394, the controller 1330 is configured to select a portion of the multiple portions of the codeword 1308 to be decoded. For example, in response to receiving a request 1362 from the device 1380, the controller 1330 may select the first portion 1312 of the codeword 1308 to be retrieved from the memory 1304. For example, the request 1362 may include a logical block address (LBA) that may be translated by the controller 1330 to a physical address of the first portion 1312. The controller 1330 may send a command to the memory device 1303 to retrieve the first portion 1312 and may receive data 1324 from the memory 1304 that includes a first representation 1326 of the first portion 1312. The first representation 1326 may correspond to the first portion 1312 and may differ from the first portion 1312 due to the presence of one or more bit errors. The controller 1330 is configured to send the first representation 1326 of the first portion 1312 to the ECC engine 1332 to initiate a decoding operation.

The ECC engine 1332 is configured to decode each portion 1312-1320 of the codeword 1308 independently of at least another portion of the codeword 1308. For example, the data 1324 received from the memory 1304 may include the first representation 1326 of the first portion 1312 and a second representation 1328 of the second portion 1316. The ECC engine 1332 may be configured to decode the first representation 1326 of the first portion 1312 independently of decoding the second representation 1328 of the second portion 1316.

The ECC engine 1332 is further configured to decode each portion of the codeword 1308 based on a sub-matrix of the parity check matrix 1342. For example, as illustrated, the memory 1350 may include a sub-matrix 1352. The sub-matrix 1352 may correspond to a vertical section of the parity check matrix 1342, such as described to reference to FIG. 4. The parity check matrix 1342 includes a first sector 1372, a second sector 1376, and one or more other sectors including a final sector 1378. In the implementation of FIG. 13, the multiple sectors 1372-1378 are aligned to read segment boundaries. However, in one or more other implementations, the multiple sectors are not aligned to read segment boundaries. In an illustrative example, for a 4 kB random read, a larger amount of data (e.g., 5-6 kB) is read that includes the 4 kB and also includes additional data adjacent to the 4 kB.

The ECC engine 1332 is configured to decode a portion of the codeword 1308 using a sector of the parity check matrix 1342. For example, to decode a single portion 1312 of the codeword 1308, the ECC engine 1332 may use a single sector 1372 for decoding. To decode a combined portion that includes the first portion 1312 and the second portion 1316, the ECC engine 1332 may use the combined sectors 1372 and 1376 of the parity check matrix 1342. Further details of an example of the parity check matrix 1342 are illustrated and described with reference to FIG. 14A and FIG. 14B.

In contrast to the random mode 1394, in the sequential mode 1395 the controller 1330 is configured to initiate decoding of the multiple portions 1312-1320 of the codeword 1308 as a single codeword at the ECC engine 1332. For example, the controller 1330 may receive the request 1362 that indicates a starting address and length of data to be retrieved from the memory 1304. In response to the request 1362, the controller 1330 may select the entire codeword 1308 to be retrieved from the memory 1304. The ECC engine 1332 is configured to use the multiple sectors 1372-1378 of the parity check matrix 1342 in the sequential mode 1395 to decode the codeword 1308.

By decoding the selected portion of the codeword 1308 in the random mode 1394 independently of the other portions of the codeword 1308, the data storage device 1302 provides enhanced performance during random read operations when read unit size is smaller than a size of the codeword 1308, as compared to implementations where the entire codeword 1308 is retrieved to decode the selected portion. In case of decoding failure of the portion of the codeword 1308, and also in the sequential mode 1395, the entire codeword 1308 may be retrieved for enhanced error correction capability. Thus, overall latency for random reads of portions of the codeword 1308 is reduced without sacrificing the error correction capability of the full codeword 1308.

Figure 14A:
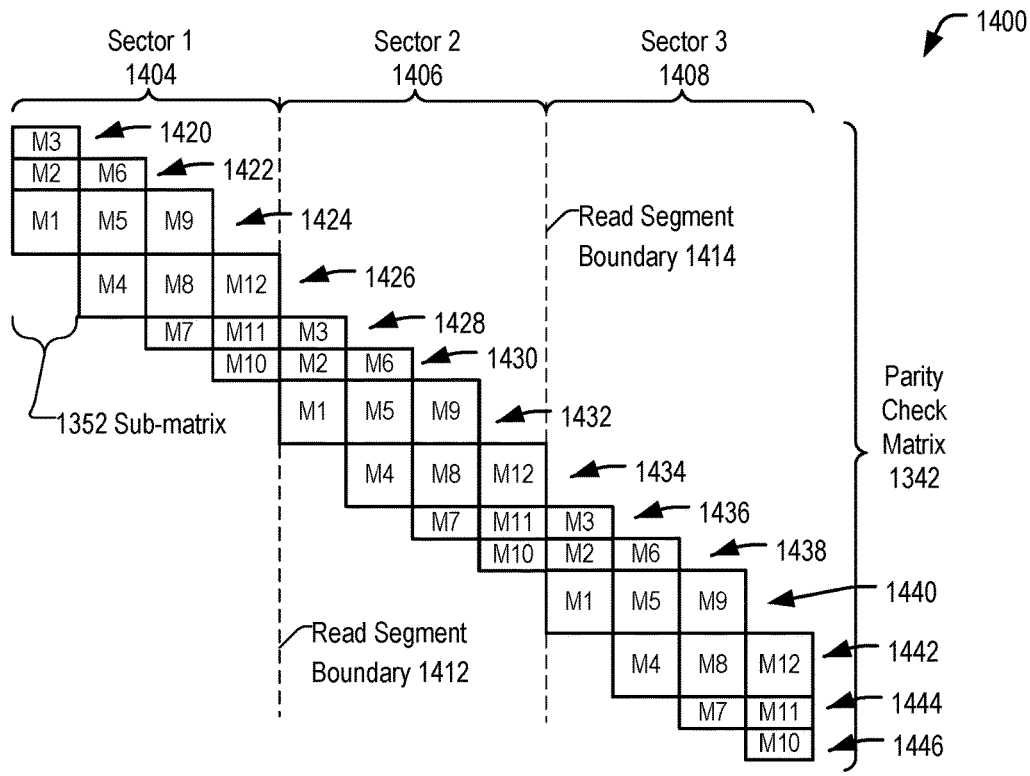
FIG. 14A is another diagram illustrating particular aspects of an example of a parity check matrix corresponding to a CLDPC code.

FIG. 14A illustrates an example 1400 of the parity check matrix 1342 of FIG. 13. The example 1400 illustrates that the parity check matrix 1342 includes multiple sectors including a first sector 1404, a second sector 1406, and a third sector 1408. The sectors 1404-1408 are aligned to read segment boundaries 1412, 1414. In a particular example, the first sector 1404 corresponds to the first sector 1372 of FIG. 13, the second sector 1406 corresponds to the second sector 1376, and the third sector 1408 corresponds to the final sector 1378.

The first sector 1404 includes four submatrices, such as the sub-matrix 1352. In FIG. 14A, the sub-matrix 1352 includes a first matrix M1, a second matrix M2, and a third matrix M3. The first matrix M1 has a first number of rows (e.g. represented as a first height of the first matrix M1 in FIG. 14A), and the second matrix M2 has a second number of rows (e.g., has a second height) that is less than the first number of rows of the first matrix M1. The third matrix M3 may also have the second number of rows. A second sub-matrix of the first sector 1404 includes matrices M4 and M5 having the first number of rows, and a matrix M6 having the second number of rows. A third sub-matrix of the first sector 1404 includes a matrix M7 having the second number of rows and matrices M8 and M9 having the first number of rows. A fourth sub-matrix of the first sector 1404 includes matrices M10 and M11 having the second number of rows and matrix M12 having the first number of rows. Each of the matrices M1-M12 in each of the sectors 1404-1406 is non-zero; all other elements of the parity check matrix 1342 are zero.

Figure 14B:
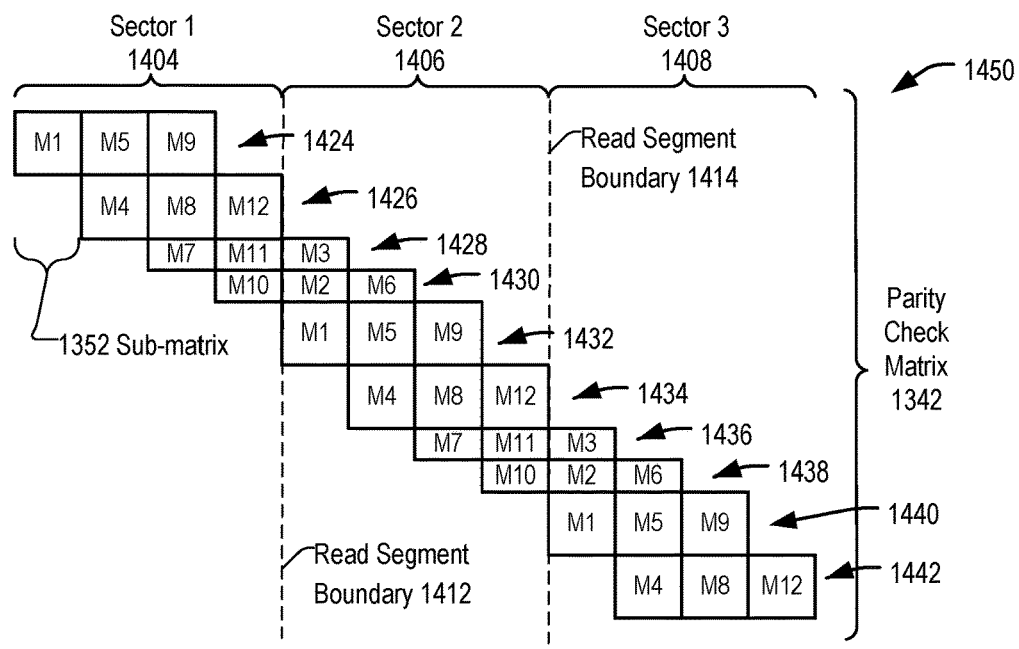
FIG. 14B is another diagram illustrating particular aspects of an example of a parity check matrix corresponding to a CLDPC code.

The matrices of the second sector 1406 match the matrices of the first sector 1404. Similarly, the matrices of the third sector 1408 also match the matrices of the first sector 1404 and the second sector 1406. Hence, a single copy of the matrices of the first sector 1404 may be stored in the memory 1350 and may be repeated within the ECC engine 1332 for decoding of one or more sectors of the codeword 1308. It should be understood that although FIG. 14A and FIG. 14B illustrate that the parity check matrix 1342 includes three sectors 1404-1408, in other implementations the parity check matrix 1342 may include fewer than three sectors or more than three sectors. For example, in an implementation where a read segment is 1 kilobyte (kB) and a write segment is 64 kB, the parity check matrix 1342 may include 64 sectors.

The parity check matrix 1342 includes multiple horizontal layers 1420, 1422, 1424, 1426, 1428, 1430, 1432, 1434, 1436, 1438, 1440, 1442, 1444, and 1446. As described with reference to FIGS. 2-6, the right-most matrix of each horizontal layer of the parity check matrix 1342 comprises a lower diagonal portion. For example, the right-most section of each of matrices M3, M6, M9, and M12 may include a lower diagonal portion. Thus, the parity check matrix 1342 may be decodable according to a windowed decoding process, such as described with reference to FIGS. 1-12.

Horizontal layers of the parity check matrix 1342 that include the matrices having the second number of rows correspond to parity checks that span multiple sectors (e.g., that include variables from two or more of the sectors 1404-1408). For example, the horizontal layer 1428 includes the matrices M7, M11, and M3 and corresponds to parity checks that are based on codeword symbols of the first sector 1404 and the second sector 1406. In contrast, horizontal layers including matrices having the first number of rows, such as the horizontal layer 1424 including the matrices M1, M5, and M9 correspond to parity checks of codeword symbols within a single sector (e.g., parity checks of the horizontal layer 1424 corresponding to matrices M1, M5, and M9 include codeword symbols within the first sector 1404 and exclude codeword symbols in any other sector 1406-1408.) As illustrated, horizontal layers 1428, 1430, 1436, and 1438 correspond to parity checks that span multiple read segments. Horizontal layers 1424, 1426, 1432, 1434, 1440, and 1442 correspond to parity checks that are contained within a single read segment. Horizontal layers 1420, 1422, 1444, and 1446 may include non-zero matrices in the parity check matrix 1342 for reduced complexity arising from symmetry of the sectors 1404-1408. The parity checks corresponding to the horizontal layers 1420, 1422, 1444, and 1446 are bypassed or ignored (e.g., "phantom" parity checks) during decoding. Alternatively, the horizontal layers 1420, 1422, 1444, and 1446 may be omitted from the parity check matrix 1352, as described in further detail with reference to FIG. 14B.

When decoding of a portion of the codeword 1308 is performed according to the random mode 1394, the ECC engine 1332 of FIG. 13 is configured to omit the parity checks that include codeword symbols that are outside of a single sector of the parity check matrix 1342. For example, when decoding a portion of a codeword corresponding to the first sector 1404, the parity checks corresponding to the horizontal layers 1420, 1422, 1428, and 1430 are omitted, and parity checks corresponding to the horizontal layers 1424 and 1426 are used for decoding the portion of the codeword. As another example, when decoding a portion of a codeword corresponding to the second sector 1406, the parity checks corresponding to the horizontal layers 1428, 1430, 1436, and 1438 are omitted, and parity checks corresponding to the horizontal layers 1432 and 1434 are used for decoding the portion of the codeword.

A second example 1450 of the parity check matrix 1342 is illustrated in FIG. 14B. In FIG. 14B, the parity check matrix 1342 includes a modified first sector 1404 and third sector 1408 that omits the "phantom" parity checks of the horizontal layers 1420, 1422, 1444, and 1446 of FIG. 14A.

To illustrate, the matrices M3, M2, and M6 on the top left (horizontal layers 1420, 1422) and matrices M7, M11, and M10 on the bottom right (horizontal layers 1444, 1446) of the parity check matrix 1342 of FIG. 14A may introduce asymmetry by including more potentially usable rows (checks) on the left-most and right-most sectors as compared to the middle sectors. Thus, more parity may be allocated to the edge segments, which may result in allocation of less parity to the inner segments. Further, in random read mode, reading one of the edge segments of FIG. 14A in aligned format may potentially result in reading less information (due to reading more parity) as compared to an amount of information read from a middle segment that includes less parity than an edge segment. As illustrated in FIG. 14B, the only matrices (and parity) available to decode in random read mode in the example 1450 are the M1-M5-M9-M4-M8-M12 set of sub-matrices, uniformly, for all read segments.

In FIG. 14A and FIG. 14B, because some parity check equations are omitted from the decoding in the random mode 1394, a decoding strength may be reduced as compared to a decoding that does not omit parity checks. By reducing the size (the number of rows) of matrices associated with parity checks that span multiple sectors and increasing the size of matrices corresponding to parity checks that are within a single sector, an amount of error correction capability diminishment from omitting parity checks spanning multiple sectors may be reduced, while retaining enhanced error correction capability across all sectors when decoding in the sequential mode 1395.

Although FIG. 14A and FIG. 14B graphically represent the number of rows of each matrix as the matrix height, it should be understood that the matrices, sub-matrices, and sectors depicted in FIG. 14A and FIG. 14B are not necessarily to scale. Although the parity checks corresponding to the horizontal layers 1420, 1422, 1444, and 1426 of FIG. 14A are described as being ignored during decoding, in other implementations one or more of the parity checks corresponding to the horizontal layers 1420, 1422, 1444, and 1446 may be used during decoding, introducing additional complexity and asymmetry, as described above, in order to increase error correction capacity.

Although FIG. 14A and FIG. 14B depict an implementation of the parity check matrix 1342 with a reduced number of parity checks across read segments and an increased number of parity check within each read segment (i.e., the second number of rows is less than the first number of rows), in other implementations all matrices in the parity check matrix 1342 may have the same height (e.g., each of M2 and M3 have the same number of rows as M1), or matrices may have other sizes (e.g., M3 may have a different number of rows than either or both of M1 and M2).

Figure 15:
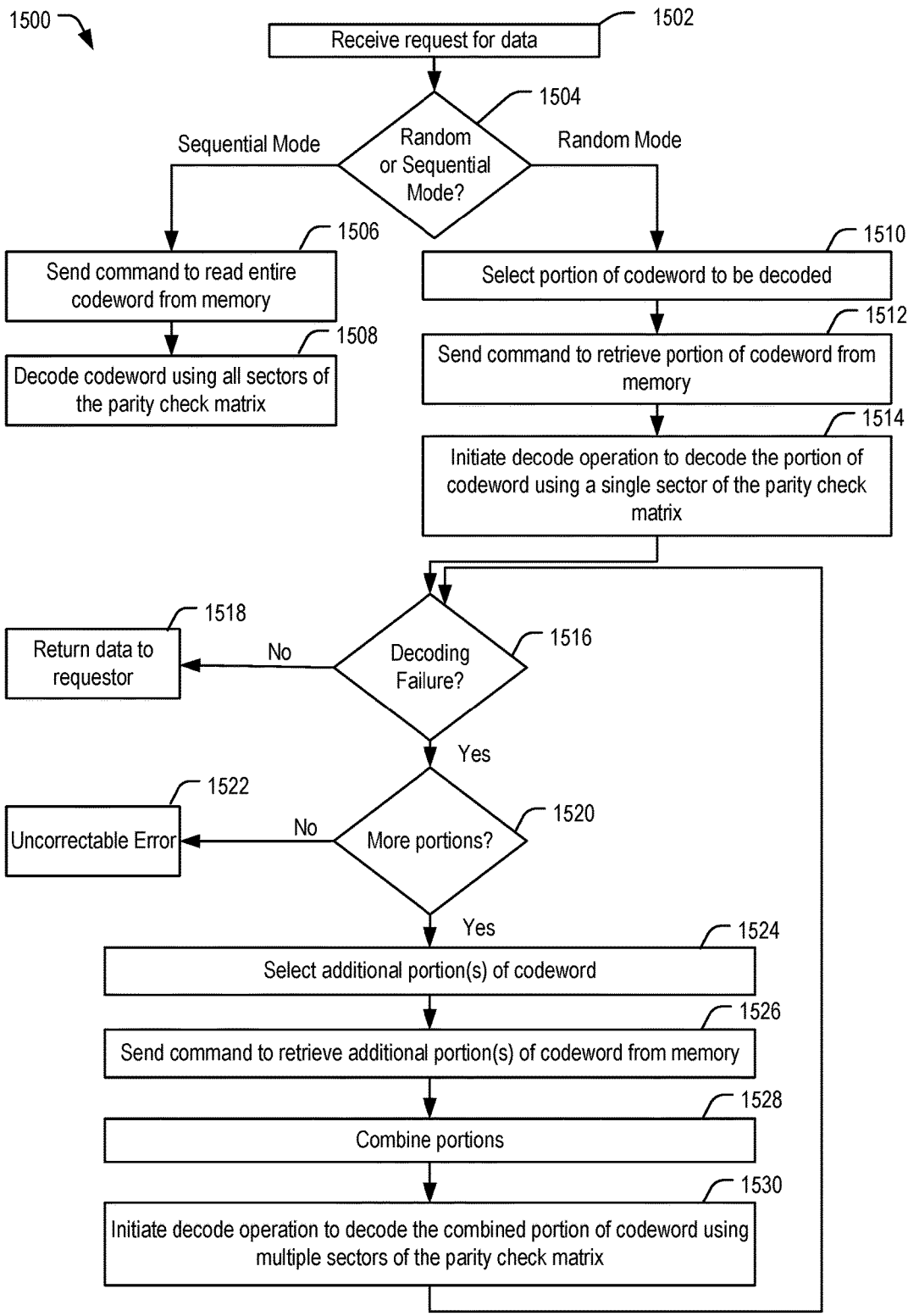
FIG. 15 is a flow chart of an illustrative example of a method of operation of a data storage device, such as the data storage device of FIG. 13.

FIG. 15 illustrates an example 1500 of a method that may be performed by the controller 1330 of FIG. 13. A request for data is received, at 1502. For example, the request may correspond to the request 1362 received from the device 1380 of FIG. 13.

A determination may be made whether processing is to be performed in random mode or sequential mode, at 1504. For example, when the request is for data from multiple contiguous logical or physical addresses, the sequential mode may be selected. In contrast, when the request is for data corresponding to a read segment that is smaller than a CLDPC codeword that includes the requested data, then the random mode may be selected.

In response to selection of the sequential mode, a command is sent to read the entire codeword from the memory, at 1506, and the codeword is decoded using all sectors of the parity check matrix, at 1508. For example, the entire codeword 1308, including all portions 1312-1320, may be read from the memory 1304 in the sequential mode 1395 and the data 1324 provided as a representation of the entire codeword 1308. The ECC engine 1332 may initiate decoding and may perform a decoding operation to correct errors in the data 1324 using all sectors 1372-1378 of the parity check matrix 1342.

Otherwise, in response to the random mode being selected, at 1504, a portion of the codeword to be decoded is selected, at 1510. For example, the controller 1330 may determine that a logical address received via the request 1362 may correspond to the first portion 1312 of the codeword 1308. The controller 1330 may select the first portion 1312 to be decoded in the random mode 1394, at 1510. A command may be sent to retrieve the portion of the codeword from the memory, at 1512. For example, the controller 1330 may send a command to the memory device 1303 to retrieve the first portion 1312 of the codeword 1308.

A decode operation may be initiated to decode the portion of the codeword using a single sector of the parity check matrix, at 1514. For example, the controller 1330 may route the first representation 1326 of the first portion 1312 of the codeword 1308 to the ECC engine 1332. The ECC engine 1332 may perform a decoding operation to decode the first representation 1326 of the first portion 1312 using a single sector (e.g., the first sector 1372) of the parity check matrix 1342.

A determination is made whether a decoding failure has occurred, at 1516. For example, the ECC engine 1332 may complete the decoding operation in response to all parity check equations being satisfied or in response to one or more failure conditions occurring. If a decoding failure has not occurred, at 1516, data resulting from decoding of the ECC engine 1332 may be returned to the requestor, at 1518. For example, the data 1360 is provided to the device 1380 of FIG. 13. Otherwise, when a decoding failure has occurred, at 1516, a determination is made whether more portions of the codeword remain untried in the decoding operation, at 1520.

If no more portions are available to be added to attempt decoding using a larger codeword portion (i.e., decoding has failed using all portions 1312-1320 of the codeword 1308), an uncorrectable error indicator may be generated, at 1522. Otherwise, when one or more portions of the codeword are available, at 1520, one or more additional portions of the codeword may be selected, at 1524. For example, when a decoding failure has resulted from attempting to decode the first portion 1312 of the codeword 1308, the controller 1330 may select the second portion 1316 adjacent the first portion 1312 to combine with the first portion 1312 as a combined codeword.

A command is sent to retrieve the additional one or more portions of the codeword from memory, at 1526. For example, the controller 1330 may send a command to the memory device 1303 to retrieve the second representation 1328 of the second portion 1316 of the codeword 1308. The portions of the codeword may be combined, at 1528. For example, the controller 1330 may combine the second representation 1328 of the second portion 1316 of the codeword 1308 with the first representation 1326 of the first portion 1312 of the codeword 1308 to form a combined portion that includes the first representation 1326 and the second representation 1328.

The controller 1330 may initiate a decode operation to decode the combined portion using multiple sectors of the parity check matrix, at 1530. For example, a combined portion of the codeword 1308 that includes the first representation 1326 and the second representation 1328 may be processed by the decoder 1336 using the first sector 1372 and the second sector 1376 of the parity check matrix 1342. After completion of the decoding operation, at 1530, a determination may again be made whether a decoding failure has occurred, at 1516.

As illustrated in FIG. 15, when decoding is performed in the random mode, a single portion of the codeword may be retrieved and decoded independently of the other portions of the codeword. Because a correction capability of the individual portions of the codeword may be sufficient for a large percentage of the data read from the memory, decoding failures of a single portion may be relatively rare. In response to a decoding failure occurring, one or more additional portions may be retrieved from the memory and combined with the failed portion for additional decoding attempts. As more portions are added, an error correction capability of the combined portions increases, and parity checks that span multiple read segments may be used to improve error correction capability associated with the first portion. By repeatedly increasing the number of sectors attempted for decoding, an error correction capability is increased until either the requested portion is decoded or decoding fails for the entire codeword, and the uncorrectable error indication is generated.

Figure 16:
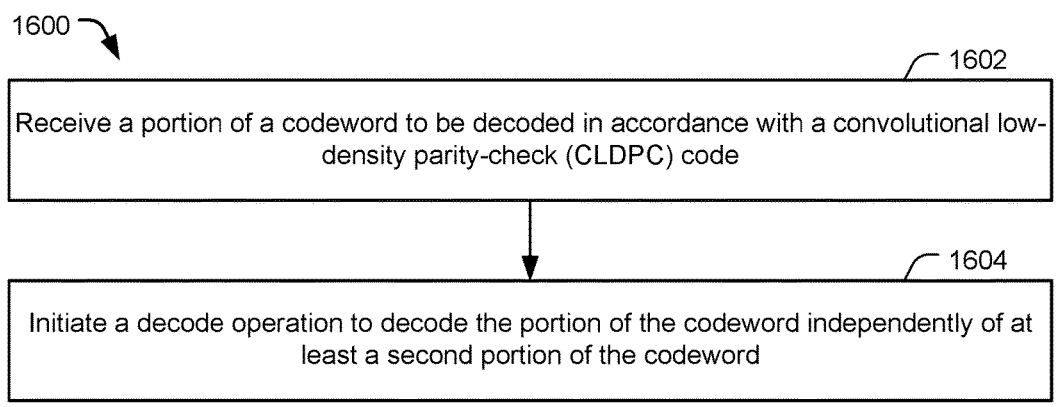
FIG. 16 is a flow chart of another illustrative example of a method of operation of a data storage device, such as the data storage device of FIG. 13.

Referring to FIG. 16, a method of operation of a data storage device is depicted and generally designated 1600. The method 1600 may be performed at the data storage device 102, the data storage device 1002, the data storage device 1302, or any combination thereof The method 1600 includes receiving a portion of a codeword to be decoded in accordance with a convolutional low-density parity-check (CLDPC) code, at 1602. For example, the portion of the codeword may correspond to one of the portions 1312-1320 of FIG. 13, such as the first representation 1326 of the first portion 1312 that is received by the controller 1330 from the memory device 1303.

A decode operation is initiated to decode the portion of the codeword independently of at least a second portion of the codeword, at 1604. For example, the decode operation may correspond to a decoding at the decoder 1336 according to the random mode 1394 of FIG. 13. In some implementations, the decode operation includes processing the portion of the codeword based on a sub-matrix of a parity check matrix (e.g., the first sector 1404 of the parity check matrix 1342 including the sub-matrix 1352), the sub-matrix including a first matrix (e.g., M1) having a first number of rows and a second matrix (e.g., M2) having a second number of rows that is less than the first number of rows. In a particular implementation, the parity check matrix includes multiple sectors aligned to read segment boundaries, such as the sectors 1404-1408 of FIG. 14A or FIG. 14B.

The method 1600 may further include, prior to receiving the portion of the codeword, receiving, from an access device, a request for data, where the data is encoded in the portion of the codeword. In an illustrative example, the data storage device 1302 receives the request 1362 for the data 1360 encoded in the first portion 1312 of the codeword 1308. In response to the request, the portion is selected from multiple portions of the codeword to be decoded according to a random mode, and a command is sent to a memory device to retrieve the portion of the codeword (e.g., to retrieve the first representation 1326 of the first portion 1312).

Decoding the portion of the codeword according to the random mode may include omitting parity checks that include codeword symbols that are outside of a single sector of the multiple sectors of the parity check matrix. For example, when decoding uses the first sector 1404 of the parity check matrix 1342, parity checks corresponding to matrices M2, M3, M6, M7, M10, and M11 may be omitted. In response to a decoding failure of the portion, the method 1600 may include selecting one or more additional portions of the codeword to combine with the portion of the codeword to form a combined portion and initiating decoding of the combined portion. For example, the second portion 1316 may be combined with the first portion 1312 upon failure to decode the first portion 1312. Decoding of the combined portions may use the first sector 1404 and the second sector 1406, omitting the rows of the horizontal layers 1420, 1422, 1436, and 1438, and including the rows of the horizontal layers 1428 and 1430 that cross the read segment boundary 1412.

By decoding the selected portion of the codeword independently of the other portions of the codeword, the method 1600 enables enhanced performance during random read operations when read unit size is smaller than a size of the codeword, as compared to implementations where the entire codeword is retrieved to decode the selected portion. In case of decoding failure of the portion of the codeword, the entire codeword (or one or more additional portions of the codeword) may be retrieved for enhanced error correction capability. Thus, overall latency for random reads of portions of the codeword is reduced without sacrificing the error correction capability of the full codeword.

Although various components depicted herein are illustrated as block components and described in general terms, such components may include one or more microprocessors, state machines, or other circuits configured to enable such components to perform one or more operations described herein. For example, one or more of the ECC engines 132, 1032, 1332 may represent physical components, such as hardware controllers, state machines, logic circuits, or other structures, to enable the controllers 130, 1030, 1330 to encode and decode data based on a CLDPC code.

Alternatively or in addition, one or more of the ECC engines 132, 1032, 1332 may be implemented using a microprocessor or microcontroller programmed to encode and decode data based on a CLDPC code. In a particular embodiment, one or more of the ECC engines 132, 1032, 1332 include a processor executing instructions (e.g., firmware) that are stored at the memories 104, 1004, 1304. Alternatively, or in addition, instructions that are executed by the processor may be stored at a separate memory location that is not part of the memories 104, 1004, 1304, such as at a read-only memory (ROM).

It should be appreciated that one or more operations described herein as being performed by the controllers 130, 1030, 1330 may be performed at the memory devices 103, 1003, 1303. As an illustrative example, in-memory ECC operations (e.g., encoding operations and/or decoding operations) may be performed at the memory devices 103, 1003, 1303 alternatively or in addition to performing such operations at the controllers 130, 1030, 1330.

The data storage devices 102, 1002, 1302 may be coupled to, attached to, or embedded within one or more accessing devices, such as within a housing of the device 180, the device 1080, or the device 1380. For example, the data storage device 102 may be embedded within the device 180 in accordance with a Joint Electron Devices Engineering Council (JEDEC) Solid State Technology Association Universal Flash Storage (UFS) configuration. Alternatively or in addition, the data storage device 1002 or the data storage device 1302 may be embedded within the device 1080 or the device 1380 in accordance with a JEDEC Solid State Technology Association UFS configuration. To further illustrate, one or more of the data storage devices 102, 1002, 1302 may be integrated within an electronic device (e.g., the device 180, the device 1080, or the device 1380), such as a mobile telephone, a computer (e.g., a laptop, a tablet, or a notebook computer), a music player, a video player, a gaming device or console, an electronic book reader, a personal digital assistant (PDA), a portable navigation device, or other device that uses internal non-volatile memory.

In one or more other implementations, one or more of the data storage devices 102, 1002, 1302 may be implemented in a portable device configured to be selectively coupled to one or more external devices, such as a host device. For example, the data storage device 102 may be removable from the device 180 (i.e., "removably" coupled to the device 180). As an example, the data storage device 102 may be removably coupled to the device 180 in accordance with a removable universal serial bus (USB) configuration. In some implementations, the data storage device 1002 is removable from the device 1080, the data storage device 1302 is removable from the device 1380, or both, such as in accordance with a removable USB configuration.

The devices 180, 1080, 1380 may correspond to a mobile telephone, a computer (e.g., a laptop, a tablet, or a notebook computer), a music player, a video player, a gaming device or console, an electronic book reader, a personal digital assistant (PDA), a portable navigation device, another electronic device, or a combination thereof. The devices 180, 1080, 1380 may communicate via a controller, which may enable the devices 180, 1080, 1380 to communicate with the data storage devices 102, 1002, 1302. The devices 180, 1080, 1380 may operate in compliance with a JEDEC Solid State Technology Association industry specification, such as an embedded MultiMedia Card (eMMC) specification or a Universal Flash Storage (UFS) Host Controller Interface specification. One or more of the devices 180, 1080, 1380 may operate in compliance with one or more other specifications, such as a Secure Digital (SD) Host Controller specification as an illustrative example. In another example, one or more of the devices 180, 1080, 1380 may communicate with the data storage devices 102, 1002, 1302 in accordance with another communication protocol. In some implementations, one or more of the data storage devices 102, 1002, 1302 may be integrated within a network-accessible data storage system, such as an enterprise data system, a network-attached storage (NAS) system, or a cloud data storage system, as illustrative examples.

In some implementations, one or more of the data storage devices 102, 1002, 1302 may include a solid state drive (SSD). One or more of the data storage devices 102, 1002, 1302 may function as an embedded storage drive (e.g., an embedded SSD drive of a mobile device), an enterprise storage drive (ESD), a cloud storage device, a NAS device, or a client storage device, as illustrative, non-limiting examples. In some implementations, the data storage device 102 may be coupled to the device 180 via a network. For example, the network may include a data center storage system network, an enterprise storage system network, a storage area network, a cloud storage network, a local area network (LAN), a wide area network (WAN), the Internet, and/or another network. In some implementations, the data storage device 1002 or 1302 is coupled to the device 1080 or 1380 via a network, such as a data center storage system network, an enterprise storage system network, a storage area network, a cloud storage network, a LAN, a WAN, the Internet, and/or another network.

To further illustrate, one or more of the data storage devices 102, 1002, 1302 may be configured to be coupled to the devices 180, 1080, 1380 as embedded memory, such as in connection with an embedded MultiMedia Card (eMMC®) (trademark of JEDEC Solid State Technology Association, Arlington, Virginia) configuration, as an illustrative example. One or more of the data storage devices 102, 1002, 1302 may correspond to an eMMC device. As another example, one or more of the data storage devices 102, 1002, 1302 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). One or more of the data storage devices 102, 1002, 1302 may operate in compliance with a JEDEC industry specification. For example, one or more of the data storage devices 102, 1002, 1302 may operate in compliance with a JEDEC eMMC specification, a JEDEC UFS specification, one or more other specifications, or a combination thereof The memories 104, 1004, 1304 may include a resistive memory (e.g., a resistive random access memory (ReRAM), as an illustrative example), a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), another type of memory, or a combination thereof. The memories 104, 1004, 1304 may include a semiconductor memory device.

In conjunction with disclosed embodiments, an apparatus includes means for storing a codeword of a convolutional low-density parity-check (CLDPC) code, the codeword including multiple portions that are independently decodable. For example, the means for storing may correspond to the memory device 1303, the memory 1304, the storage region 1306, one or more other devices or components to store a codeword of a CLDPC code, or a combination thereof The apparatus also includes means for controlling the means for storing, the means for controlling configured to select a portion of the multiple portions of the codeword to be decoded. For example, the means for controlling may correspond to the controller 1330, the ECC engine 1332, the decoder 1336, one or more other devices or components to select a portion of the multiple portions of the codeword to be decoded, or a combination thereof In some implementations, the apparatus includes means for error correction code (ECC) decoding the portion of the codeword independently of at least a second portion of the codeword. For example, the means for ECC decoding the portion of the codeword may correspond to the controller 1330, the ECC engine 1332, the decoder 1336, one or more other devices or components to decode the portion of the codeword independently of a second portion of the codeword, or a combination thereof Semiconductor memory devices include volatile memory devices, such as dynamic random access memory ("DRAM") or static random access memory ("SRAM") devices, non-volatile memory devices, such as resistive random access memory ("ReRAM"), magnetoresistive random access memory ("MRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where they direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in they direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional exemplary structures described but cover all relevant memory structures within the spirit and scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. An apparatus comprising:
a memory configured to store a codeword of a convolutional low-density parity-check (CLDPC) code, the codeword having a first size and including multiple portions that are independently decodable and that have a second size smaller than the first size; and
a controller coupled to the memory, the controller comprising:
a CLDPC encoder configured to encode the codeword; and
a CLDPC decoder configured to decode a first portion of the multiple portions of the codeword independently of a second portion of the multiples portions of the codeword.

2. The apparatus of claim 1, wherein the controller is further configured, in response to a decoding failure of the first portion, to:
select one or more additional portions of the multiple portions of the codeword to combine with the first portion of the codeword to form a combined portion; and
initiate decoding of the combined portion.

3. The apparatus of claim 1, the CLDPC decoder further configured to decode the first portion of the codeword based on a sub-matrix of a parity check matrix.

4. The apparatus of claim 3, the parity check matrix including a plurality of copies of the sub-matrix.

5. The apparatus of claim 3, the sub-matrix including:
a first matrix having a first number of rows; and
a second matrix having a second number of rows that is less than the first number of rows.

6. The apparatus of claim 3, the parity check matrix including multiple sectors aligned to read segment boundaries.

7. The apparatus of claim 6, wherein:
each sector of the multiple sectors includes multiple first matrices and multiple second matrices;
each of the first matrices has a first number of rows;
each of the second matrices has a second number of rows that is less than the first number of rows;
each row of the first matrices represents a parity check of codeword symbols within a single sector of the multiple sectors; and
each row of the second matrices represents a parity check of codeword symbols that spans more than one sector of the multiple sectors.

8. The apparatus of claim 6, wherein the controller is further configured to select the first portion of the multiple portions of the codeword to be decoded according to a random mode, and wherein the controller is further configured to initiate decoding of the codeword at the CLDPC decoder according to a sequential mode.

9. The apparatus of claim 8, wherein the CLDPC decoder is further configured to use the multiple sectors of the parity check matrix in the sequential mode, and wherein the CLDPC decoder is configured to omit parity checks that include codeword symbols that are outside of a single sector of the multiple sectors of the parity check matrix in the random mode.

10. A method comprising:
receiving, with a controller of a data storage device, a first portion of a codeword to be decoded in accordance with a convolutional low-density parity-check (CLDPC) code; and
initiating, with the controller, a decode operation to decode the first portion of the codeword independently of at least a second portion of the codeword;
wherein the codeword has a first size that is larger than a second size of the first portion of the codeword.

11. The method of claim 10, wherein the decode operation includes processing the first portion of the codeword based on a sub-matrix of a parity check matrix, the sub-matrix including:
a first matrix having a first number of rows; and
a second matrix having a second number of rows that is less than the first number of rows.

12. The method of claim 10, wherein the decode operation includes processing the first portion of the codeword based on a sub-matrix of a parity check matrix, the parity check matrix including multiple sectors aligned to read segment boundaries.

13. The method of claim 12, further comprising, prior to receiving the first portion of the codeword:
receiving, from an access device, a request for data, wherein the data is encoded in the first portion of the codeword;
in response to the request, selecting the first portion from multiple portions of the codeword to be decoded according to a random mode; and
sending a command to a memory device to retrieve the first portion of the codeword.

14. The method of claim 13, wherein decoding the first portion of the codeword according to the random mode includes omitting parity checks that include codeword symbols that are outside of a single sector of the multiple sectors of the parity check matrix.

15. The method of claim 14, further comprising, in response to a decoding failure of the first portion:
selecting one or more additional portions of the codeword to combine with the first portion of the codeword to form a combined portion; and
initiating decoding of the combined portion.

16. An apparatus comprising:
means for storing a codeword of a convolutional low-density parity-check (CLDPC) code, the codeword having a first size and including multiple portions that are independently decodable and that have a second size smaller than the first size;
means for controlling the means for storing, the means for controlling configured to select the codeword or a first portion of the codeword for decoding; and
means for decoding the first portion of the codeword independently of at least a second portion of the codeword.

17. The apparatus of claim 16, wherein the means for controlling is further configured, in response to a decoding failure of the first portion, to:
select one or more additional portions of the multiple portions of the codeword to combine with the first portion of the codeword to form a combined portion; and
initiate decoding of the combined portion.

18. The apparatus of claim 16, wherein the means for decoding is further configured to omit parity checks that include codeword symbols that are outside of a single sector of multiple sectors of a parity check matrix that corresponds to the CLDPC code.

* * * * *